United States Patent
Lee et al.

(10) Patent No.: US 12,301,191 B2
(45) Date of Patent: May 13, 2025

(54) GAIN STAGE DEGENERATION INDUCTOR SWITCHING WITHOUT THE USE OF SWITCHES

(71) Applicant: SKYWORKS SOLUTIONS, INC., Irvine, CA (US)

(72) Inventors: Junhyung Lee, Irvine, CA (US); Johannes Jacobus Emile Maria Hageraats, Kamuela, HI (US)

(73) Assignee: SKYWORKS SOLUTIONS, INC., Carlsbad, CA (US)

( * ) Notice: Subject to any disclaimer, the term of this patent is extended or adjusted under 35 U.S.C. 154(b) by 667 days.

(21) Appl. No.: 17/566,324

(22) Filed: Dec. 30, 2021

(65) Prior Publication Data

US 2022/0255519 A1 Aug. 11, 2022

Related U.S. Application Data

(60) Provisional application No. 63/132,920, filed on Dec. 31, 2020.

(51) Int. Cl.
*H03G 3/30* (2006.01)
*H03F 1/22* (2006.01)
(Continued)

(52) U.S. Cl.
CPC ............ *H03G 3/3026* (2013.01); *H03F 3/72* (2013.01); *H03G 1/0029* (2013.01); *H04B 1/0053* (2013.01); *H03F 1/22* (2013.01); *H03F 2200/294* (2013.01); *H03G 3/12* (2013.01); *H03G 2201/103* (2013.01)

(58) Field of Classification Search
CPC ............ H03G 3/3026; H03G 1/0029; H03G 2201/103; H03F 3/72; H03F 2200/294; H03F 2200/451; H03F 2200/489; H03F 2200/492; H03F 2203/7239; H03F 1/223;
(Continued)

(56) References Cited

U.S. PATENT DOCUMENTS 7,474,158 B1 * 1/2009 Yim ..................... H03F 3/72
330/311
7,853,235 B2 * 12/2010 Aparin ................. H03F 1/301
455/295

(Continued)

OTHER PUBLICATIONS

Written Opinion of the International Searching Authority for PCT/US2021/065758, Apr. 19, 2022, in 6 pages.
(Continued)

*Primary Examiner* — Khanh V Nguyen
(74) *Attorney, Agent, or Firm* — Chang & Hale LLP

(57) ABSTRACT

Disclosed herein are signal amplifier architectures that provide a plurality of gain modes. Different gain modes can use different paths through the amplifier architecture. Switches that are used to select the path through the amplifier architecture can be configured to also provide targeted impedance in a degeneration block or matrix. The switches that select the gain path are provided in the amplifier architecture and are thus not needed or used in the degeneration block, thereby reducing the size of the package for the amplifier architecture, improving the noise figure (NF), improving impedance matching, and eliminating the need for control logic associated with the degeneration block or matrix.

20 Claims, 12 Drawing Sheets

(51) Int. Cl.
 *H03F 3/72* (2006.01)
 *H03G 1/00* (2006.01)
 *H03G 3/12* (2006.01)
 *H04B 1/00* (2006.01)

(58) Field of Classification Search
 CPC ..... H03F 3/195; H04B 1/0053; H04B 1/0458; H04B 2001/0408
 USPC ........................................................ 330/283
 See application file for complete search history.

(56) References Cited

U.S. PATENT DOCUMENTS

| 9,917,614 | B1 | 3/2018 | Kang |
| 2009/0174481 | A1* | 7/2009 | Chang ..................... H03F 3/72 330/296 |
| 2015/0146771 | A1 | 5/2015 | Walter |
| 2015/0341007 | A1 | 11/2015 | Youssef et al. |
| 2016/0036392 | A1* | 2/2016 | Bohsali .................... H03F 3/72 330/296 |
| 2019/0089319 | A1 | 3/2019 | Korol et al. |
| 2019/0207639 | A1* | 7/2019 | Hageraats ............ H04B 7/0882 |

OTHER PUBLICATIONS

International Search Report for PCT/US2021/065758, Apr. 19, 2022, in 4 pages.

* cited by examiner

GAIN STAGE DEGENERATION INDUCTOR SWITCHING WITHOUT THE USE OF SWITCHES

CROSS-REFERENCE TO RELATED APPLICATIONS

This application claims priority to U.S. Prov. App. No. 63/132,920 filed Dec. 31, 2020 and entitled "GAIN STAGE DEGENERATION INDUCTOR SWITCHING WITHOUT THE USE OF SWITCHES," which is incorporated by reference herein in its entirety for all purposes.

BACKGROUND

Field

The present disclosure generally relates to amplifiers for wireless communication applications.

Description of Related Art

Wireless communication devices typically include components in a front-end module that are configured to amplify received radio-frequency (RF) signals. The front-end module can include a plurality of gain modes to provide different levels of amplification.

SUMMARY

According to a number of implementations, the present disclosure relates to a variable-gain signal amplifier. The amplifier includes a variable-gain stage configured to receive an input signal and generate an amplified output signal. The amplifier also includes a degeneration matrix coupled to the variable-gain stage and configured to provide a plurality of tailored impedance levels for the variable-gain stage depending on a path through the variable-gain stage, the degeneration matrix not including any switches.

In some embodiments, the amplifier is configured to selectively provide a bypass path that bypasses the variable-gain stage and an amplification path that passes through the variable-gain stage.

In some embodiments, the degeneration matrix is further configured to provide tailored impedances to the variable gain stage depending on a gain mode of a plurality of gain modes of the variable gain signal amplifier. In further embodiments, the tailored impedances are configured to provide improved linearity in the amplified output signal relative to a variable gain stage that is not coupled to the degeneration matrix with the tailored impedances. In further embodiments, the degeneration matrix is configured to provide a first tailored impedance for a first gain mode of the plurality of gain modes and a second tailored impedance for a second gain mode of the plurality of gain modes. In further embodiments, the first tailored impedance is greater than the second tailored impedance and the first gain mode is less than the second gain mode.

In some embodiments, the amplifier further includes a bypass block coupled to an input of the variable gain stage, the bypass block configured to be activated in a low gain mode to provide a bypass path that does not include the variable-gain stage. In further embodiments, the bypass path does not include the degeneration matrix.

In some embodiments, the degeneration matrix is configured to provide three or more degeneration inductor switching.

In some embodiments, the amplifier further includes a plurality of input nodes coupled to the variable-gain stage. In further embodiments, the amplifier is configured to receive a plurality of input signals at the plurality of input nodes, individual received signals having frequencies within different signal frequency bands. In further embodiments, the amplifier is configured to amplify signals received at individual input ports independent of amplification of other received signals. In further embodiments, the degeneration matrix is configured to provide two or more degeneration inductor switching.

According to a number of implementations, the present disclosure relates to a front end architecture. The front end architecture includes a variable gain signal amplifier including a variable-gain stage configured to receive an input signal and generate an amplified output signal and a degeneration matrix coupled to the variable-gain stage and configured to provide a plurality of tailored impedance levels for the variable-gain stage depending on a path through the variable-gain stage, the degeneration matrix not including any switches. The front end architecture also includes a filter assembly coupled to the variable gain signal amplifier to direct frequency bands to select inputs of the variable gain signal amplifier. The front end architecture also includes a controller implemented to control the variable gain signal amplifier to provide a plurality of gain modes such that, in a low gain mode, the variable gain signal amplifier directs signals along a path that bypasses the variable-gain stage.

In some embodiments, the degeneration matrix is further configured to provide three or more tailored impedances to the variable-gain stage. In further embodiments, the tailored impedances are configured to provide improved linearity in the amplified output signal relative to a variable gain stage that is not coupled to the degeneration matrix with the tailored impedances. In further embodiments, the degeneration matrix is configured to provide a first tailored impedance for a first gain mode of a plurality of gain modes and a second tailored impedance for a second gain mode of the plurality of gain modes.

According to a number of implementations, the present disclosure relates to a wireless device. The wireless device includes a diversity antenna. The wireless device also includes a filter assembly coupled to the diversity antenna to receive signals and to direct frequency bands along select paths. The wireless device also includes a variable gain signal amplifier including a variable-gain stage configured to receive an input signal and generate an amplified output signal and a degeneration matrix coupled to the variable-gain stage and configured to provide a plurality of tailored impedance levels for the variable-gain stage depending on a path through the variable-gain stage, the degeneration matrix not including any switches. The wireless device also includes a controller implemented to control the variable gain signal amplifier to provide a plurality of gain modes such that, in a low gain mode, the variable gain signal amplifier directs signals along a path that bypasses the variable-gain stage.

In some embodiments, the degeneration matrix is further configured to provide three or more tailored impedances to the variable-gain stage. In further embodiments, the degeneration matrix is configured to provide a first tailored impedance for a first gain mode of a plurality of gain modes and a second tailored impedance for a second gain mode of the plurality of gain modes.

For purposes of summarizing the disclosure, certain aspects, advantages, and novel features have been described herein. It is to be understood that not necessarily all such advantages may be achieved in accordance with any particular embodiment. Thus, the disclosed embodiments may be carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Overview

Signal amplifiers in wireless devices, such as low noise amplifiers (LNAs) and power amplifiers (PAs), can be designed to amplify signals while providing desired characteristics, such as a targeted noise figure (NF) or targeted linearity. Certain wireless devices are designed to provide a plurality of gain modes, providing different levels of amplification. However, in such devices, the signal amplifiers may suffer from reduced performance in one or more of the gain modes and thus may fail to achieve the desired characteristics across the plurality of gain modes. For example, linearity may suffer across the plurality of gain modes.

Accordingly, disclosed herein are signal amplifier architectures that provide tailored impedances using a degeneration block or matrix without using switches in the degeneration switching block. The disclosed signal amplifier architectures provide a plurality of gain modes where different gain modes use different paths through the amplifier architecture. Switches that are used to select the path through the amplifier architecture also provide targeted impedances in a degeneration block or matrix. The switches that select the gain path are provided in the amplifier architecture and are thus not needed or used in the degeneration block, thereby reducing the size of the package for the amplifier architecture, improving the noise figure (NF), improving impedance matching, and eliminating the need for control logic associated with the degeneration block or matrix.

Figure 1:
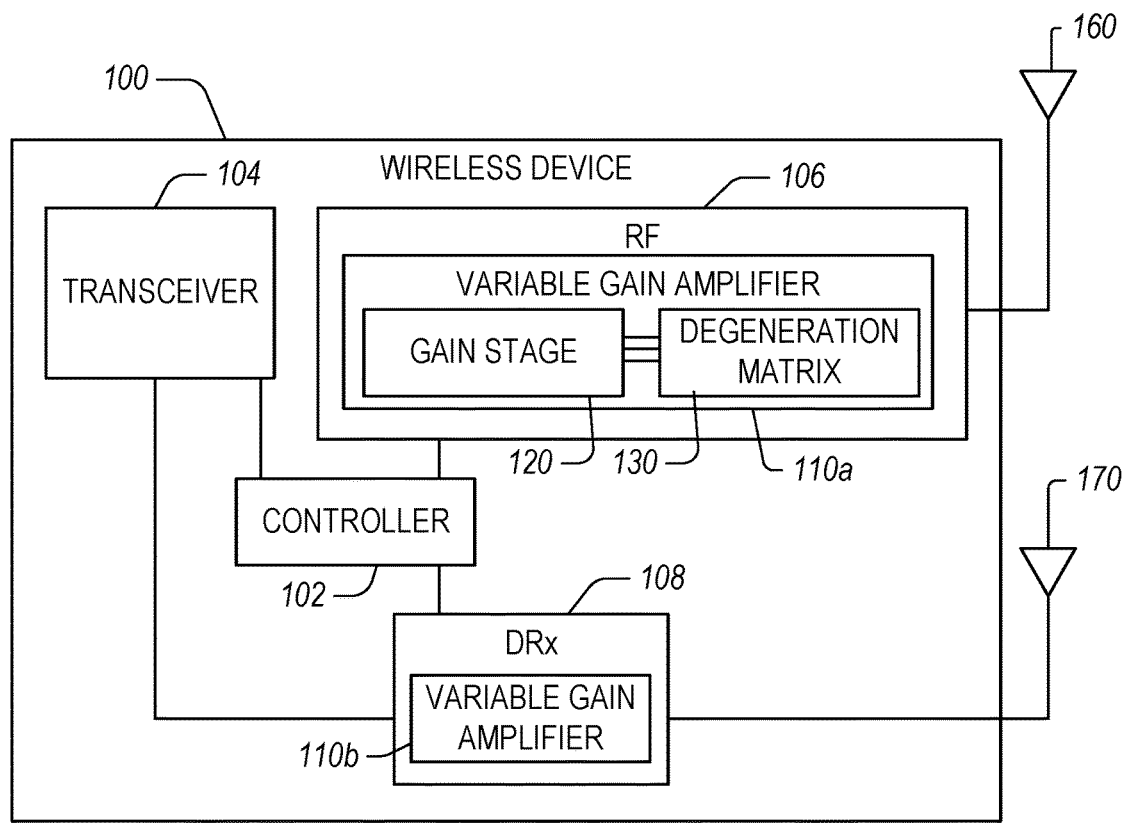
FIG. 1 illustrates an example wireless device having a primary antenna and a diversity antenna.

FIG. 1 illustrates an example wireless device 100 having a primary antenna 160 and a diversity antenna 170. The wireless device 100 includes an RF module 106 and a transceiver 104 that may be controlled by a controller 102. The transceiver 104 is configured to convert between analog signals (e.g., radio-frequency (RF) signals) and digital data signals. To that end, the transceiver 104 may include a digital-to-analog converter, an analog-to-digital converter, a local oscillator for modulating or demodulating a baseband analog signal to or from a carrier frequency, a baseband processor that converts between digital samples and data bits (e.g., voice or other types of data), or other components.

The RF module 106 is coupled between the primary antenna 160 and the transceiver 104. Because the RF module 106 may be physically close to the primary antenna 160 to reduce attenuation due to cable loss, the RF module 106 may be referred to as a front-end module (FEM). The RF module 106 may perform processing on an analog signal received from the primary antenna 160 for the transceiver 104 or received from the transceiver 104 for transmission via the primary antenna 160. To that end, the RF module 106 may include filters, power amplifiers, low noise amplifiers, band select switches, attenuators, matching circuits, and other components.

When a signal is transmitted to the wireless device 100, the signal may be received at both the primary antenna 160 and the diversity antenna 170. The primary antenna 160 and diversity antenna 170 may be physically spaced apart such that the signal at the primary antenna 160 and diversity antenna 170 is received with different characteristics. For example, in one embodiment, the primary antenna 160 and the diversity antenna 170 may receive the signal with different attenuation, noise, frequency response, and/or phase shift. The transceiver 104 may use both of the signals with different characteristics to determine data bits corresponding to the signal. In some implementations, the transceiver 104 selects from between the primary antenna 160 and the diversity antenna 170 based on the characteristics, such as selecting the antenna with the highest signal-to-noise ratio. In some implementations, the transceiver 104 combines the signals from the primary antenna 160 and the diversity antenna 170 to increase the signal-to-noise ratio of the combined signal. In some implementations, the transceiver 104 processes the signals to perform multiple-input/ multiple-output (MiMo) communication.

In some embodiments, the diversity antenna 170 is configured to receive signals within multiple cellular frequency bands and/or wireless local area network (WLAN) frequency bands. In such embodiments, the wireless device 100 can include a multiplexer, switching network, and/or filter assembly coupled to the diversity antenna 170 that is configured to separate the diversity signal into different frequency ranges. For example, the multiplexer can be configured to include a low pass filter that passes a frequency range that includes low band cellular frequencies, a bandpass filter that passes a frequency range that includes low band WLAN signals and mid-band and high-band cellular signals, and a high pass filter that passes a frequency range that includes high-band WLAN signals. This example is merely for illustrative purpose. As another example, the multiplexer can have a variety of different configurations such as a diplexer that provides the functionality of a high pass filter and a low pass filter.

Because the diversity antenna 170 is physically spaced apart from the primary antenna 160, the diversity antenna 170 can be coupled to the transceiver 104 by a transmission line, such as a cable or a printed circuit board (PCB) trace. In some implementations, the transmission line is lossy and attenuates the signal received at the diversity antenna 170 before it reaches the transceiver 104. Thus, in some implementations, gain is applied to the signal received at the diversity antenna 170. The gain (and other analog processing, such as filtering) may be applied by the diversity receiver module 108. Because such a diversity receiver module 108 may be located physically close to the diversity antenna 170, it may be referred to as a diversity receiver front-end module, examples of which are described in greater detail herein.

The RF module 106 and the diversity receiver module 108 include respective variable gain amplifiers 110a, 110b configured to provide a plurality of gain modes to amplify signals from the primary antenna 160 and the diversity antenna 170, respectively. The variable gain amplifiers 110a, 110b can include a plurality of amplifier architectures 120 and a degeneration matrix 130 that changes inductance based at least in part on a gain mode of the variable gain amplifier 110a, 110b. Individual amplifier architectures 120 can be activated by the variable gain amplifier 110a, 110b based at least in part on an operating gain mode. The activated amplifier architecture can be designed to provide targeted or desired characteristics for the particular gain mode(s) directed to the architecture. In this way, desired characteristics can be enhanced for individual gain modes. Signals received at the variable gain amplifiers 110a, 110b can be amplified using a particular amplifier architecture selected by the variable gain amplifier 110a, 110b, or the signals can be allowed to bypass the amplifier architectures 120, as described in greater detail herein. The selected amplifier architecture 120, the inductance of the degeneration matrix 130, the bypass path, and/or the gain mode of the variable gain amplifier 110a, 110b can be controlled by the controller 102. The degeneration matrix 130 can be configured to provide an inductance that increases performance of the variable gain amplifier 110a, 110b relative to an amplifier with fixed inductance. Performance can be increased by increasing linearity and/or by reducing noise introduced during amplification, for example. The variable gain amplifier 110a, 110b can receive multiple input signals and output a single signal or a plurality of output signals. The degeneration matrix 130 can be configured to not include any switches. The inductance provided by the degeneration matrix 130 can be controlled by way of switches that select a gain stage path (e.g., in the amplifier architectures 120 or in a gain stage) in the variable gain amplifier 110a, 110b.

Advantageously, by removing switches from the degeneration matrix 130, area on the die that includes the amplifier 110a, 110b can be reduced or the area that otherwise would have included switches can be repurposed. Furthermore, removing switches from the degeneration matrix 130 improves the noise figure (NF) due at least in part to the reduction of losses associated with additional series switches in the amplifier path. Additionally, increasing the input impedance makes matching the previous stage easier, reducing impedance mismatch performance losses. In addition, the degeneration matrix 130 that does not include switches can advantageously provide tailored impedances without requiring associated control logic to control switches in the degeneration matrix 130.

The variable gain amplifier 110a, 110b can advantageously achieve targeted or improved linearity by using a dedicated amplifier architecture with tailored electrical properties. Similarly, the variable gain amplifier 110a, 110b can advantageously achieve targeted or improved NF by using a dedicated amplifier architecture with tailored electrical properties. Likewise, the variable gain amplifier 110a, 110b can advantageously achieve targeted or improved NF and/or linearity using a degeneration matrix 130 with tailored inductances. The degeneration matrix 130 can advantageously provide these tailored inductances without using switches in the degeneration matrix 130. The variable gain amplifier 110a, 110b can provide targeted or improved input to output isolation through the use of a shunt switch in a bypass path and/or in one or more of the amplifier architectures 120.

The controller 102 can be configured to generate and/or send control signals to other components of the wireless device 100. In some embodiments, the controller 102 provides signals based at least in part on specifications provided by the mobile industry processer interface alliance (MIPI® Alliance). The controller 102 can be configured to receive signals from other components of the wireless device 100 to process to determine control signals to send to other components. In some embodiments, the controller 102 can be configured to analyze signals or data to determine control signals to send to other components of the wireless device 100. The controller 102 can be configured to generate control signals based on gain modes provided by the wireless device 100. For example, the controller 102 can send control signals to the variable gain amplifiers 110a, 110b to control the gain mode. Similarly, the controller 102 can be configured to generate control signals to select amplifier architectures 120 to activate for particular gain modes. The controller 102 can be configured to generate control signals to control the variable gain amplifier 110a, 110b to provide a bypass path. The controller 102 can be configured to select a gain path through the variable gain amplifier 110a, 110b that thereby controls the inductances or impedances provided by the degeneration matrix 130, as described herein.

In some implementations, the controller 102 generates amplifier control signal(s) based on a quality of service metric of an input signal received at the input. In some implementations, the controller 102 generates the amplifier control signal(s) based on a signal received from a communications controller, which may, in turn, be based on a quality of service (QoS) metric of the received signal. The QoS metric of the received signal may be based, at least in part, on the diversity signal received on the diversity antenna 170 (e.g., an input signal received at the input). The QoS metric of the received signal may be further based on a signal received on a primary antenna 160. In some implementations, the controller 102 generates the amplifier control signal(s) based on a QoS metric of the diversity signal without receiving a signal from the communications controller. In some implementations, the QoS metric includes a signal strength. As another example, the QoS metric may include a bit error rate, a data throughput, a transmission delay, or any other QoS metric. In some implementations, the controller 102 controls the gain (and/or current) of the amplifiers in the variable gain amplifiers 110a, 110b. In some implementations, the controller 102 controls the gain of other components of the wireless device 100 based at least in part on an amplifier control signal.

The variable gain amplifiers 110a, 110b may include a step-variable gain amplifier configured to amplify received signals with a gain of one of a plurality of configured amounts indicated by an amplifier control signal. In some implementations, the variable gain amplifiers 110a, 110b may include a continuously-variable gain amplifier configured to amplify received signals with a gain proportional to or dictated by the amplifier control signal. In some implementations, the variable gain amplifiers 110a, 110b may include a step-variable current amplifier configured to amplify received signals by drawing a current of one of plurality of configured amounts indicated by the amplifier control signal. In some implementations, the variable gain amplifiers 110a, 110b may include a continuously-variable current amplifier configured to amplify received signals by drawing a current proportional to the amplifier control signal.

Figure 2:
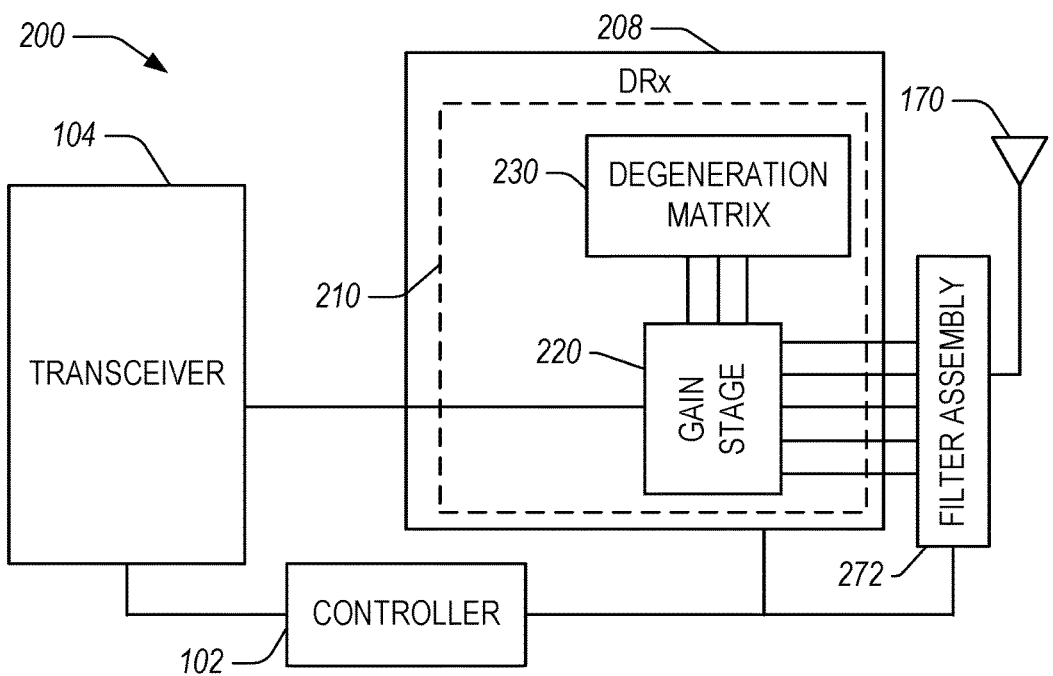
FIG. 2 illustrates an example diversity receiver (DRx) configuration including a DRx front-end module (FEM).

FIG. 2 illustrates an example diversity receiver (DRx) configuration 200 including a DRx front-end module (FEM) 208. It is to be understood that the features of the DRx FEM 208 can be implemented in any front-end module described herein, such as the RF module 106 described herein with reference to FIG. 1. The DRx configuration 200 includes a diversity antenna 170 that is configured to receive a diversity signal and to provide the diversity signal to the DRx FEM 208 through a filter assembly 272. The filter assembly 272 can include a multiplexer, for example, that is configured to selectively direct signals within targeted frequency ranges along respective paths to an amplifier 210 having a multi-input stage 212 that is coupled to amplifier architectures 220 that include a low NF core 222 and a high linearity core 224. The signals can be radio frequency (RF) signals that include, for example and without limitation, cellular signals (e.g., low-, mid-, high- and/or ultra-high-band cellular frequencies), WLAN signals, BLUETOOTH® signals, GPS signals, and the like.

The multi-input gain stage 212 is coupled to a degeneration matrix 230 that does not include switches. The degeneration matrix 230 is configured to provide tailored impedances for individual paths through the multi-input gain stage 212. In some embodiments, a gain mode of the amplifier 210 determines the path through the multi-input gain stage 212 which in turn determines the impedance or inductance provided by the degeneration matrix 230. Similarly, the gain mode of the amplifier 210 determines which core 222, 224 of the amplifier architectures 220 is used in amplifying the diversity signal.

The DRx FEM 208 is configured to perform processing on the diversity signals received from the filter assembly 272. For example, the DRx FEM 208 may be configured to filter the diversity signals to one or more active frequency bands that can include cellular and/or WLAN frequency bands. The controller 102 can be configured to control the DRx FEM 208 to selectively direct signals to targeted filters to accomplish the filtering. As another example, the DRx FEM 208 may be configured to amplify one or more of the filtered signals using a particular active core 222, 224 of the amplifier architectures 220. To that end, the DRx FEM 208 may include filters, low-noise amplifiers, band select switches, matching circuits, and other components. The controller 102 can be configured to interact with components in the DRx FEM 208 to intelligently select paths for the signals through the DRx FEM 208. As a consequence of the path selected by the controller 102, the degeneration matrix 230 provides an inductance corresponding to the selected path without the use of switches in the degeneration matrix 230 itself. As a result, the controller 102 advantageously does not include control logic to control switches within the degeneration matrix 230 thereby simplifying the controller 102.

The DRx FEM 208 transmits at least a portion of the processed diversity signals to the transceiver 104. The transceiver 104 may be controlled by the controller 102. In some implementations, the controller 102 may be implemented within the transceiver 104.

The DRx FEM 208 can be configured to provide a plurality of gain modes. For the plurality of gain modes, different amplifier architectures 220 can be selected to amplify input signals. In one or more gain modes, the signals can be routed to a low NF core 222 to amplify signals with an emphasis on achieving a low NF. In some embodiments, signals are routed to the low NF core 222 in high gain modes. In one or more gain modes, the signals can be routed to a high linearity core 224 to amplify signals with an emphasis on achieving a targeted linearity. In some embodiments, signals are routed to the high linearity core 224 in low or medium gain modes. It is to be understood that different amplifier architectures may also be implemented that provide targeted performance characteristics including, for example and without limitation, NF, linearity, gain, bandwidth, power consumption, stability, input or output matching, reverse isolation, or any combination of these. Such amplifier architectures may be implemented in place of or in addition to the amplifier architectures described herein.

For the plurality of gain modes, different inductances can be provided by the degeneration matrix 230. The degeneration matrix 230 provides tailored impedances in a multi-input amplifier architecture. In one or more gain modes, switches in the multi-input gain stage 212 direct signals to a targeted core of the amplifier architectures 220 which causes the degeneration matrix 230 to couple a particular impedance (e.g., an inductance) to the amplifier 220. In the same gain modes, switches in the multi-input gain stage 212 can direct signals along a different path which results in a different impedance being coupled to the amplifier 220 by the degeneration matrix 230. Providing these impedances with the degeneration matrix 230 can be done to improve linearity of the amplification process, for example, or to provide improved impedance matching and/or improved IIP3. In certain implementations, the path through the multi-input gain stage 212 can change without changing a gain mode and/or can change when changing gain modes.

In some embodiments, the DRx configuration 200 is configured to bypass amplification when operating in a low gain mode and to amplify signals with a particular amplifier architecture 220 when operating in other gain modes. This can advantageously allow the DRx configuration 200 to improve linearity and/or NF in particular gain modes.

In some embodiments, the amplifier 210 is configured to receive a plurality of input signals and to provide a single output signal. In certain embodiments, the amplifier 210 can be configured to receive a plurality of input signals and provide a corresponding plurality of output signals. The filter assembly 272 can be configured to direct signals corresponding to particular frequency bands along designated paths to the amplifier 210. The amplifier 210 can provide different gain modes for the received signals. In certain implementations, the amplifier 210 can provide different gain modes for the received signals. The degeneration matrix 230 can provide different impedances based on the path through the multi-input gain stage 212, the path through the multi-input gain stage 212 (and thus the provided impedance) being based at least in part on the gain mode of the amplifier 210. The amplifier architectures 220 can provide different amplification characteristics so that different gain modes can be amplified using particular amplifier architectures to achieve desired or targeted amplification performance. The particular amplifier architecture that is selected, such as the low NF core 222 or the high linearity core 224, can be based on the gain mode of the amplifier 210. In certain implementations, the amplifier 210 can operate in a bypass configuration such that the signal passes through a bypass path 240 and in an amplification configuration such that the signal passes through an amplification path that includes a selected amplifier architecture, such as low NF core 222 or high linearity core 224. This can advantageously allow the DRx FEM 208 to provide variable gain and/or a plurality of gain modes while reducing the negative impacts on linearity (e.g., IIP3) and/or noise factor (NF) relative to configurations that do not selectively provide amplifier architectures for particular gain modes. The amplifier 210 can include any suitable amplifier circuit configured to provide a desired or targeted amplification. In some embodiments, the amplifier 210 includes a low-noise amplifier (LNA) circuit configured to amplify signals from a plurality of frequency bands (e.g., cellular frequency bands and/or WLAN frequency bands) received at a plurality of inputs, or a multi-input LNA. However, it is to be understood that the embodiments described herein are not to be limited to implementations that utilize low-noise amplifiers but include implementations that use any of a variety of amplifiers.

The amplifier 210 can be configured to amplify signals based at least in part on a plurality of gain modes. For example, the amplifier 210 can be configured to provide a first amplification or gain for a first gain mode, a second amplification or gain for a second gain mode, and so on. The amplifier 210 can be controlled by the controller 102 to control the gain provided at the amplifier 210. For example, the controller 102 can provide a signal indicative of a desired or targeted gain to the amplifier 210 and the amplifier 210 can provide the targeted gain. The controller 102 may receive an indication of the targeted gain from another component in a wireless device, for example, and control the amplifier 210 based at least in part on that indication. Similarly, the amplifier architectures 220 can be activated based at least in part on a gain mode and/or targeted gain of the amplifier 210. Likewise, the degeneration matrix 230 can provide a tailored impedance based at least in part on the path through the multi-input gain stage 212 which can be determined by the gain mode and/or targeted gain of the amplifier 210.

The controller 102 can be configured to control the DRx FEM 208 to selectively provide tailored gain performance due at least in part to a tailored impedance provided by the degeneration matrix 230. For example, the controller 102 and the DRx FEM 208 can control the amplifier architectures 220 to direct signals to a targeted amplifier core (e.g., low NF core 222 or high linearity core 224) based at least in part on a gain mode. As another example, the controller 102 and the DRx FEM 208 can control the amplifier 210 to provide a bypass path 240 based at least in part on a gain mode. As another example, the controller 102 and the DRx FEM 208 can use the amplifier 210 to provide a plurality of gain modes.

Example Architectures of Variable Gain Amplifiers

Front end modules generally include amplifiers such as low-noise amplifiers (LNAs) to amplify received signals. In wireless devices that provide a variety of gain modes, it may be advantageous to provide tailored impedances at a gain stage to improve performance. Similarly, for at least one gain mode, it may be advantageous to bypass a gain stage to improve performance (e.g., improve linearity).

Accordingly, provided herein are variable gain amplifiers that provide tailored impedances at a degeneration matrix depending at least in part on a gain mode of the variable gain amplifier and/or an amplification path through the variable gain amplifier. This advantageously reduces or eliminates performance penalties in one or more gain modes. Furthermore, the tailored impedances can be configured to improve linearity of the amplification process in targeted gain modes. Similarly, the variable gain amplifier can be configured to provide a low-loss bypass mode in a low gain mode to improve signal quality.

The disclosed degeneration matrixes do not include any switches. The disclosed variable gain amplifiers with a degeneration matrix advantageously reduce a die size by removing large switches that would otherwise be included in a degeneration inductor switching block. The disclosed amplifiers with the degeneration matrix also improve NF performance for the amplifiers. Furthermore, the degeneration matrix enables a tailored impedance that can advantageously facilitate matching with previous stages without causing mismatches that adversely affect RF performance. Moreover, the disclosed degeneration matrixes do not require switching control logic for the degeneration matrix due to the lack of switches.

The disclosed degeneration matrixes can be configured to improve NF performance of the amplifiers. For example, the removal of switches from the degeneration matrix removes the adverse effects on noise figure caused by switches in the amplification path. In some embodiments, a smaller degeneration inductance is used for higher gains and a larger inductance is used for lower gains, thereby improving performance without the negative effects of adding switches to the amplification path.

The disclosed degeneration matrixes can be configured to facilitate impedance matching with prior stages in the amplification process. This can be done with little or no negative effects on RF performance compared to degeneration matrices with switches. For example, when a switch turns off it becomes fairly capacitive. Capacitive loading in the degeneration block impacts impedance as well as stability. Thus, it is advantageous to remove switches from the degeneration block. Furthermore, the disclosed degeneration matrixes are advantageously inductive rather than capacitive because a capacitive degeneration block may induce undesirable oscillations into the amplification process. Thus, it is desirable to remove capacitance from the degeneration block and the disclosed degeneration matrixes advantageously remove switches and capacitance while still providing tailored impedances for different gain modes and/or different amplification paths. Effectively, switching occurs in the gain stage of the disclosed amplifiers. Thus, although there are no switches in the degeneration block, there are switches in the gain stage and other locations in the disclosed amplifiers.

Figure 3:
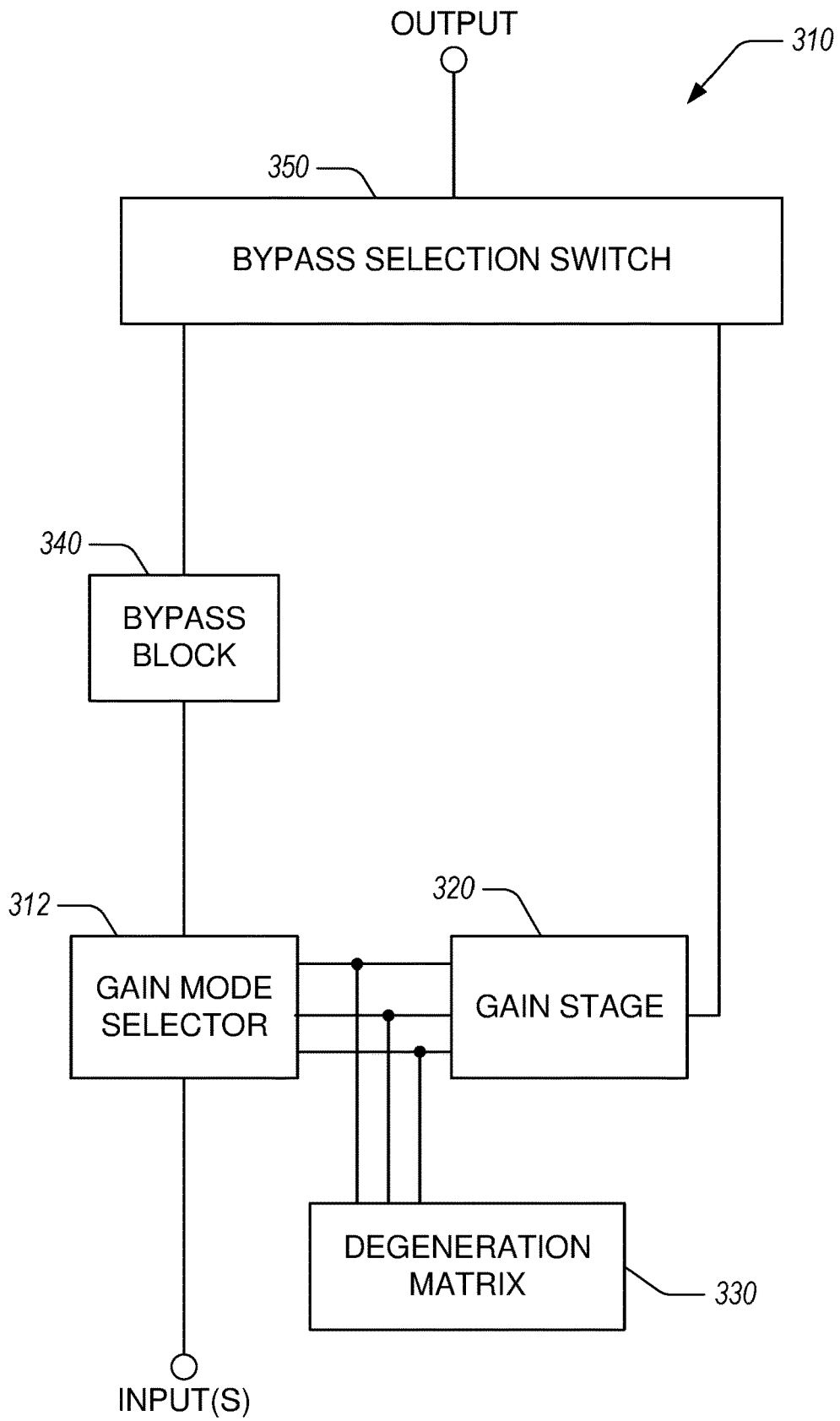
FIG. 3 illustrates an example variable gain amplifier configuration that includes a gain mode selector and a gain stage configured to receive one or more inputs and to selectively amplify the received signals with the gain stage or to provide a bypass path through a bypass block.

FIG. 3 illustrates an example variable gain amplifier configuration 310 that includes a gain mode selector 312 and a gain stage 312 configured to receive one or more inputs and to selectively amplify the received signals with the gain stage 320 or to provide a bypass path through a bypass block 340. A degeneration matrix 330 is coupled to the gain mode selector 312 and to the gain stage 320. The degeneration matrix is configured to provide tailored impedances based at least in part on a gain mode of the variable gain amplifier configuration 310 and/or a path through the gain stage 320. In certain implementations, the gain stage 312 is configured to receive multiple signals at distinct input ports, each distinct input port configured to receive signals at one or more particular cellular frequency bands. For example, a signal in a first band can be received at a first input port, a signal in a second band can be received at a second input port, and a signal in a third band can be received at a third input port.

In certain implementations, the bypass block 340 includes a shunt switch that can provide high input to output isolation relative to configurations with such a switch. The variable gain amplifier 310 can be configured to provide a low-loss direct bypass mode by directing signals from the input through the bypass block 340 and not the gain stage 320. The low-loss direct bypass mode can be implemented in a low gain mode, for example.

The variable gain amplifier 310 includes the gain mode selector 312 and a voltage to current gain stage 320. The gain mode selector 312 can be configured to provide isolation between inputs. The variable gain amplifier 310 can be configured to achieve relatively high linearity through the use of the degeneration matrix 330 without the use of switches in the degeneration matrix 330. The path through the gain stage 320 selected by the gain mode selector determines the inductance or impedance provided by the degeneration matrix 330. The degeneration matrix 330 does not include switches, therefore switching is provided by the gain mode selector 312 and/or a combination of the gain mode selector 312 and the gain stage 320.

The degeneration matrix 330 is configured to provide impedance to the gain stage 320 input. This can improve performance by providing power and/or noise matching with prior stages in the processing chain. The degeneration matrix 330 can be configured to improve linearity of the gain stage 320 by providing a feedback mechanism. In some embodiments, the degeneration matrix 330 is configured to provide a first impedance for a first gain mode and a second impedance for a second gain mode. The tailored impedances provided by the degeneration matrix 330 can also be configured to improve linearity of the gain stage 320. The variable gain amplifier 310 can be configured to bypass the degeneration matrix 330 in a bypass mode. This can improve linearity performance by reducing or minimizing leakage current passing through the gain stage 320.

The bypass block 340 is configured to receive signals from the multiple inputs and to provide a path to the output that does not pass through the gain stage 320 or the degeneration matrix 330. The bypass block 340 can include components that serve to isolate the input and output in one or more of the gain modes provided by the variable gain amplifier 310.

The bypass selection switch 350 is configured to selectively provide a path from the inputs through the bypass block 340 to the output or a path from the inputs through the gain stage 320 to the output. The bypass selection switch 350 can include one or more switching elements to isolate and/or to select the desired path based at least in part on a gain mode of the variable gain amplifier 310.

In certain embodiments, the variable gain amplifier 310 can be configured to provide a plurality of gain modes, e.g., gain modes G0, G1, . . . , GN with G0 being the highest gain and GN being a bypass mode. When operating in gain mode GN, the variable gain amplifier 310 can be configured to direct signals from the inputs to the bypass block 340. When operating in gain modes G0 to GN−1, the variable gain amplifier 310 can be configured to direct signals through the gain stage 320 and to activate the degeneration matrix 330. The degeneration matrix 330 can be configured to provide different impedance levels for individual gain modes or for groups of gain modes, depending on the path through the amplifier 310. Even in these gain modes, the bypass block 340 may be at least partially activated by activating a shunt switch in the bypass block 340 to provide isolation between the inputs and the output. The variable gain amplifier 310 can be configured to activate the medium gain mode feedback block 350a for one or more of the gain modes G0 to GN−1.

The variable gain signal amplifier 310 can be configured to achieve relatively low noise and high linearity (e.g., higher IIP3) relative to amplifiers without the disclosed bypass block 340 and degeneration matrix 330. The variable gain signal amplifier 310 can be configured to amplify radio frequency (RF) signals such as cellular signals, WLAN signals, BLUETOOTH® signals, GPS signals, and the like. The variable gain signal amplifier 310 can be configured to provide broadband capabilities by receiving signals over a plurality of frequency bands at the multiple inputs and processing these signals. The variable gain signal amplifier 310 can be configured to independently process signals at the respective inputs. The variable gain signal amplifier 310 can be configured to be controlled by a control circuit assembly, such as a controller (e.g., the controller 102 described herein with reference to FIGS. 1 and 2). The control circuit assembly can intelligently and selectively switch paths between an amplification path and a bypass path and can provide impedances with the degeneration matrix 330 by controlling the path through the amplifier, as described more fully herein.

It is to be understood that the variable gain amplifier 310 can include any suitable number of inputs. For example and without limitation, the variable gain amplifier 310 can include at least 2 inputs, at least 4 inputs, at least 8 inputs, at least 16 inputs, at least 32 inputs, at least 64 inputs, or at least any number of inputs in the described ranges. As another example and without limitation, the variable gain amplifier 310 can include less than or equal to 64 inputs, less than or equal to 32 inputs, less than or equal to 16 inputs, less than or equal to 8, less than or equal to 4 inputs, or less than or equal to any number of inputs in the described ranges.

Figure 4:
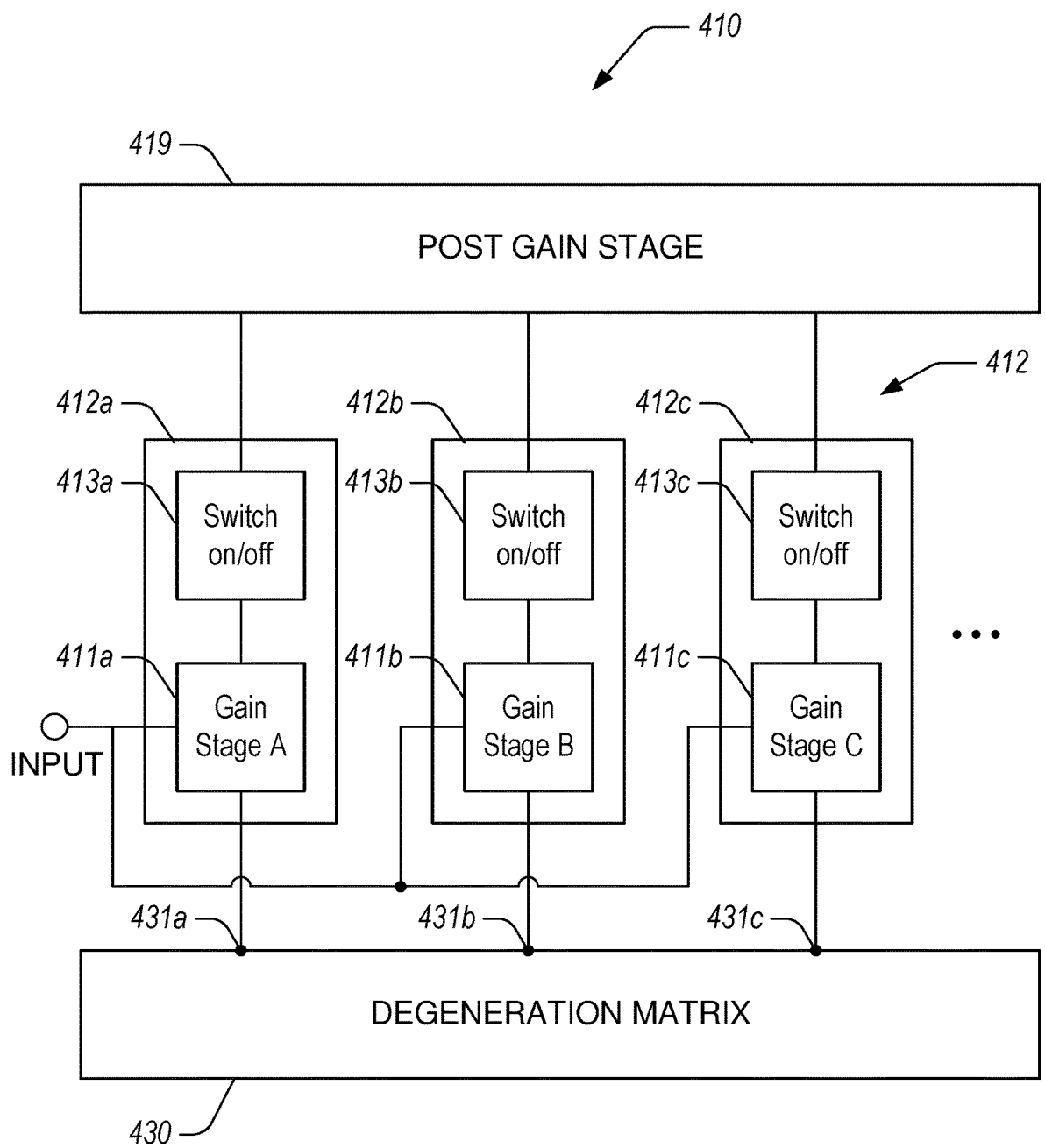
FIG. 4 illustrates an amplifier with multiple gain stage mapping to multiple degeneration circuits without using switches.

FIG. 4 illustrates an amplifier 410 with multiple gain stage mapping to multiple degeneration circuits without using switches. The amplifier 410 includes an input stage 412 with individual input paths 412a-c. Each input path 412a-c includes a corresponding gain stage 411a-c and a path switch 413a-c. The amplifier 410 includes a degeneration matrix 430 coupled to the individual paths 412a-c of the input stage 412. The amplifier 410 also includes a post gain stage 419 that includes circuitry to complete amplification of signals received at the input. The post gain stage 419 can include any suitable circuitry to complete amplification, such as cascode buffers, feedback caps, leakage switches, tunable matching, output loads, etc.

Signals received at the input are directed along an input path 412a-412c by switching on and off the corresponding path switch 413a-c. This opens a path through the input stage 412 for signals and creates a corresponding entry path 431a-c into the degeneration matrix 430. The degeneration matrix 430 is configured to provide a tailored impedance (e.g., an inductance) based on the entry path 431a-c into the degeneration matrix 430. For example, a signal is directed through the first input path 412a by turning path switch 413a on and turning off the remaining path switches 413b, 413c. The signal is amplified by Gain Stage A 411a in conjunction with the post gain stage 419, the enabled signal path having a first tailored impedance provided by the degeneration matrix 430 resulting from the entry path 431a into the degeneration matrix 430. As another example, a signal is directed through the second input path 412b by turning path switch 413b on and turning off the remaining path switches 413a, 413c. The signal is amplified by Gain Stage B 411b in conjunction with the post gain stage 419, the enabled signal path having a second tailored impedance provided by the degeneration matrix 430 resulting from the entry path 431b into the degeneration matrix 430. As another example, a signal is directed through the third input path 412c by turning path switch 413c on and turning off the remaining path switches 413b, 413c. The signal is amplified by Gain Stage C 411c in conjunction with the post gain stage 419, the enabled signal path having a third tailored impedance provided by the degeneration matrix 430 resulting from the entry path 431c into the degeneration matrix 430.

Figure 5A:
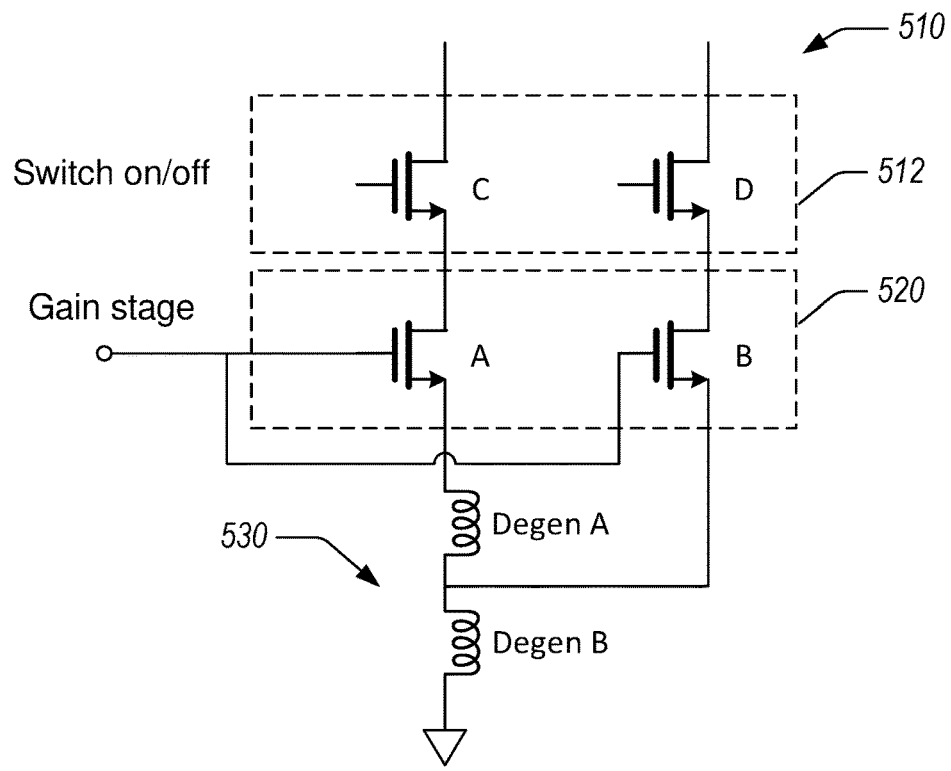
FIG. 5A illustrates an amplifier with a degeneration matrix coupled to a gain stage and gain switching, the degeneration matrix providing two degeneration inductor switching.
Figure 5B:
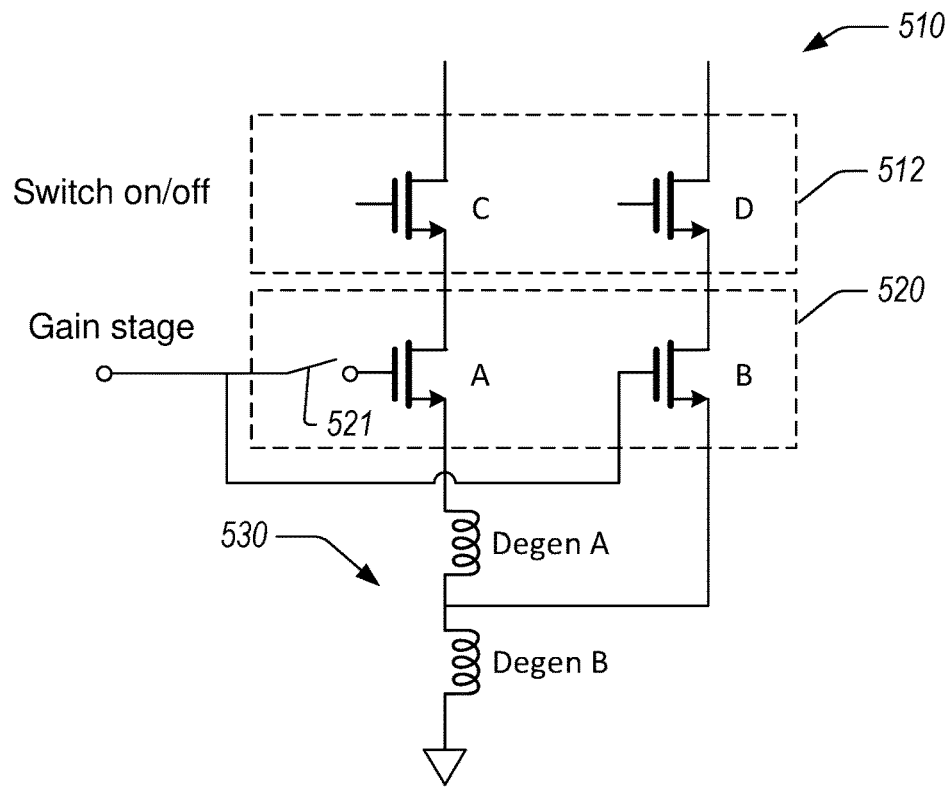
FIG. 5B illustrates that the gain stage can include an optional isolation switch to isolate the inputs to gain stages A and B.

FIG. 5A illustrates an amplifier 510 with a degeneration matrix 530 coupled to a gain stage 520 and gain switching 512, the degeneration matrix 530 providing two degeneration inductor switching. Input signals are received at the input and directed through a particular path through the gain stage 520 using the gain switching 512. The path through the gain stage 520 determines the inductance provided by the degeneration matrix 530. There are no switches in the degeneration matrix 530. FIG. 5B illustrates that the gain stage 520 can include an optional isolation switch 521 to isolate the inputs to gain stages A and B.

Figure 6A:
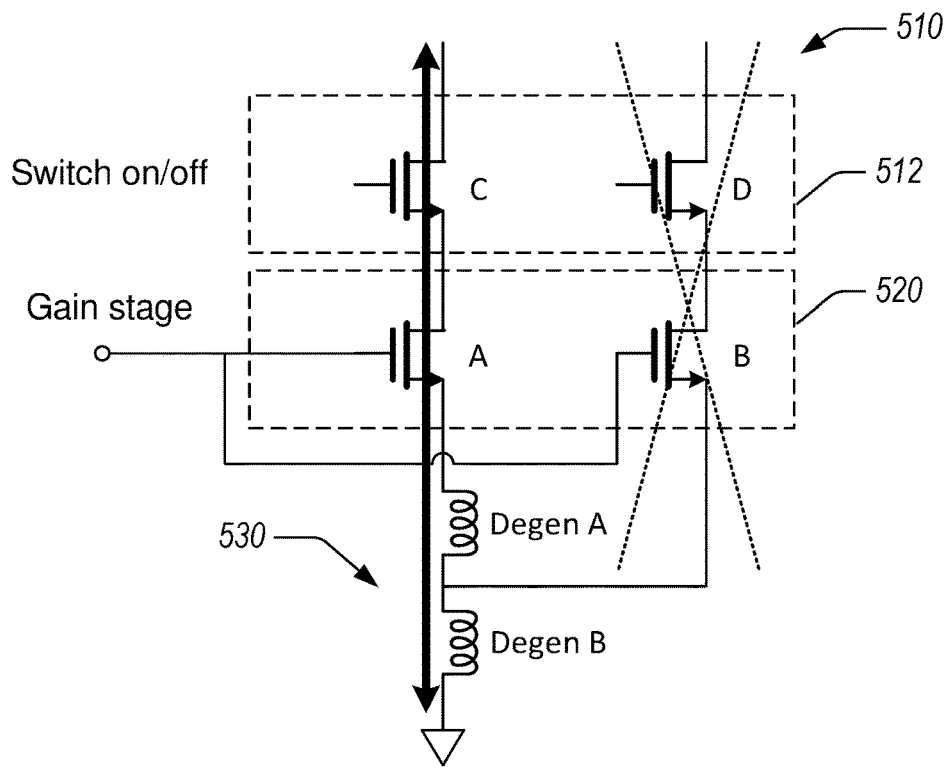
FIG. 6A illustrates an example of a signal directed through gain stage A in the gain stage.

FIG. 6A illustrates an example of a signal directed through gain stage A in the gain stage 520. This signal path sees an impedance provided by both inductor degen A an inductor degen B in the degeneration matrix 530. This is controlled by switching on switch C and switching off switch D in the gain switching 512. This can be done, for example, in a low or medium gain mode or a high linearity mode.

Figure 6B:
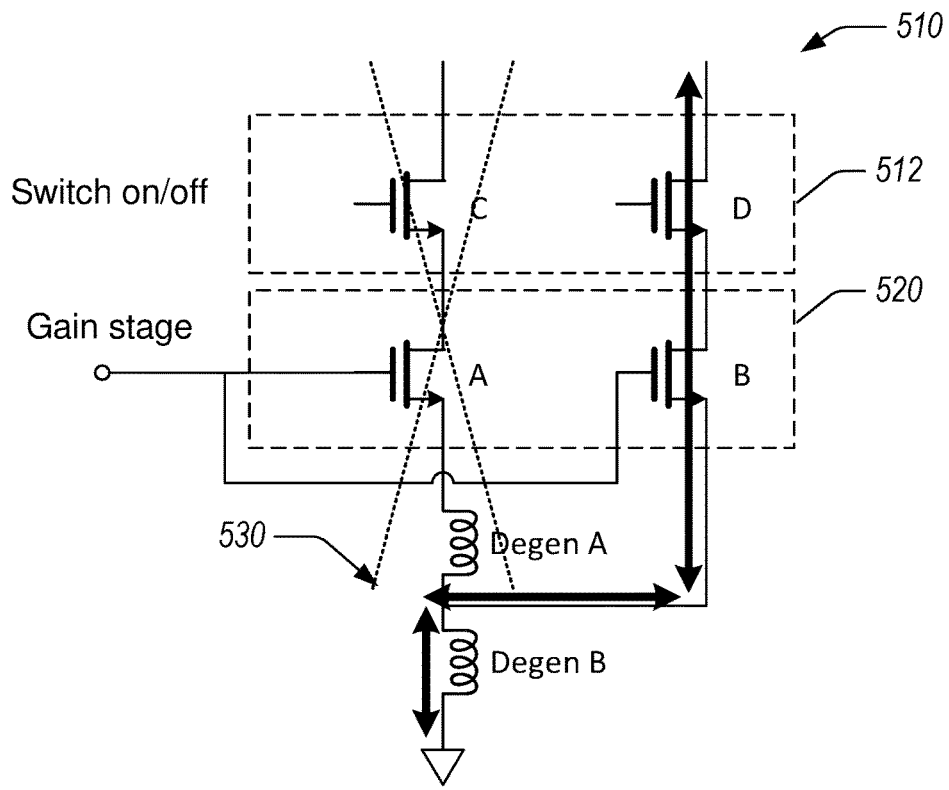
FIG. 6B illustrates an example of a signal directed through gain stage B in the gain stage.
Figure 6C:
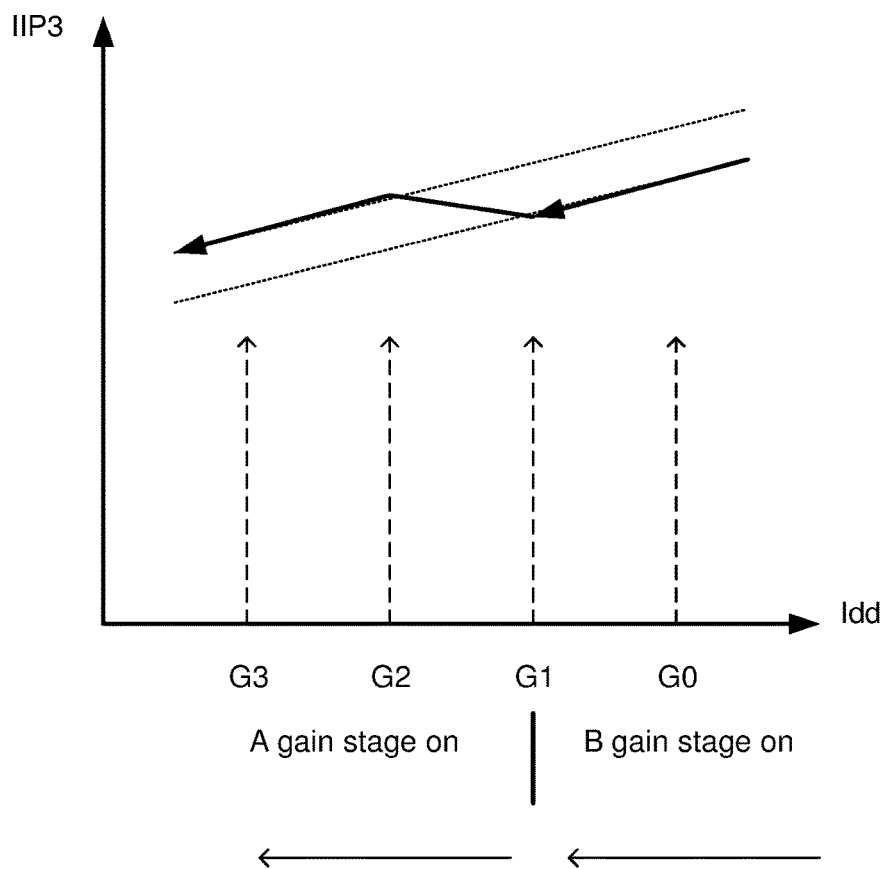
FIG. 6C illustrates a graph of the third-order intercept point of the examples of FIGS. 6A and 6B.
Figure 6D:
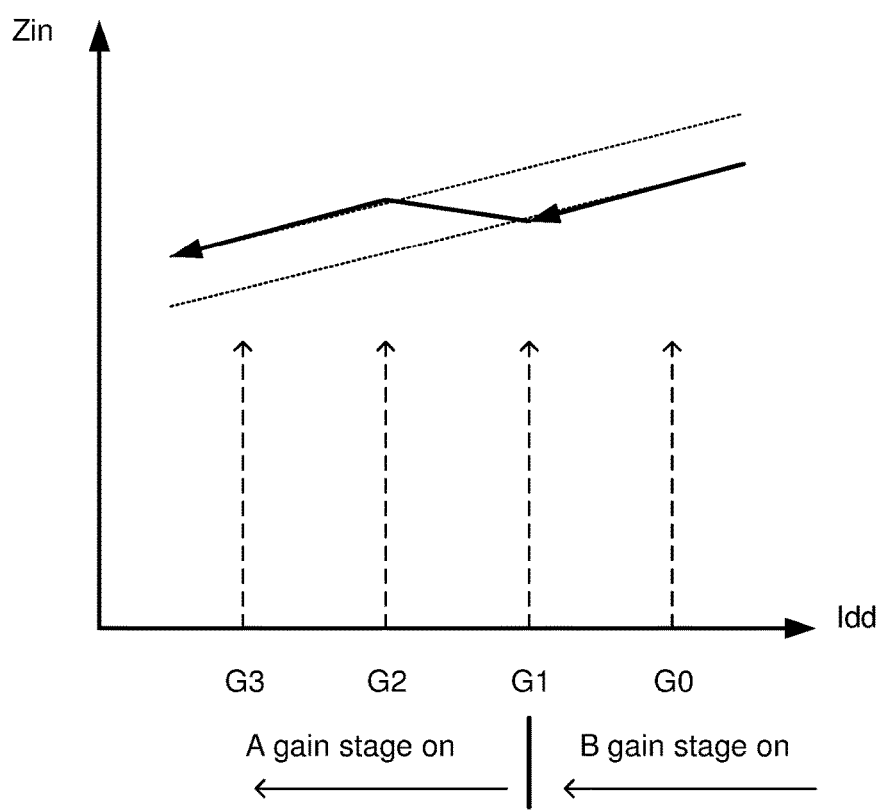
FIG. 6D illustrates a graph of the impedance of the examples of FIGS. 6A and 6B.

FIG. 6B illustrates an example of a signal directed through gain stage B in the gain stage 520. This signal path sees an impedance provided by the inductor degen B (and not the inductor degen A) in the degeneration matrix 530. This is controlled by switching off switch C and switching on switch D in the gain switching 512. This can be done, for example, in a high gain mode or a low NF mode. The examples of FIGS. 6A and 6B are further illustrated in the graphs of FIGS. 6C and 6D.

Figure 7:
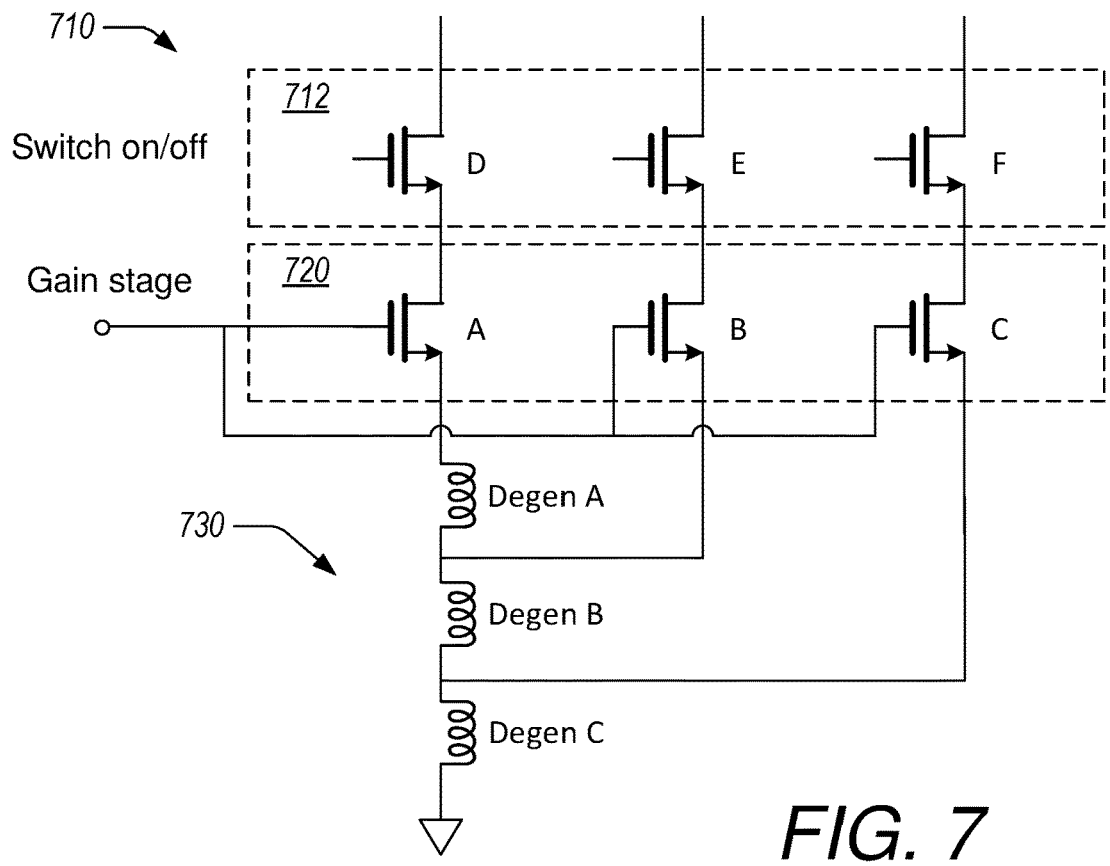
FIG. 7 illustrates an amplifier with a degeneration matrix coupled to a gain stage and gain switching, the degeneration matrix providing three degeneration inductor switching.

FIG. 7 illustrates an amplifier 710 with a degeneration matrix 730 coupled to a gain stage 720 and gain switching 712, the degeneration matrix 730 providing three degeneration inductor switching. The amplifier 710 is similar to the amplifier 510 with the addition of another gain stage (gain stage C) and another degeneration inductor degen C. Operation is otherwise similar to the amplifier 510, as illustrated by the examples in FIGS. 8A-8C. The amplifier 710 illustrates that the disclosed concepts of degeneration inductor switching can be extended to any number of inductors using a suitable number of gain stages and gain switches. Thus, it should be understood that the disclosed concepts are not to be limited to embodiments with two and three degeneration inductor switching, but can be extended to four or more degeneration inductor switching.

Figure 8A:
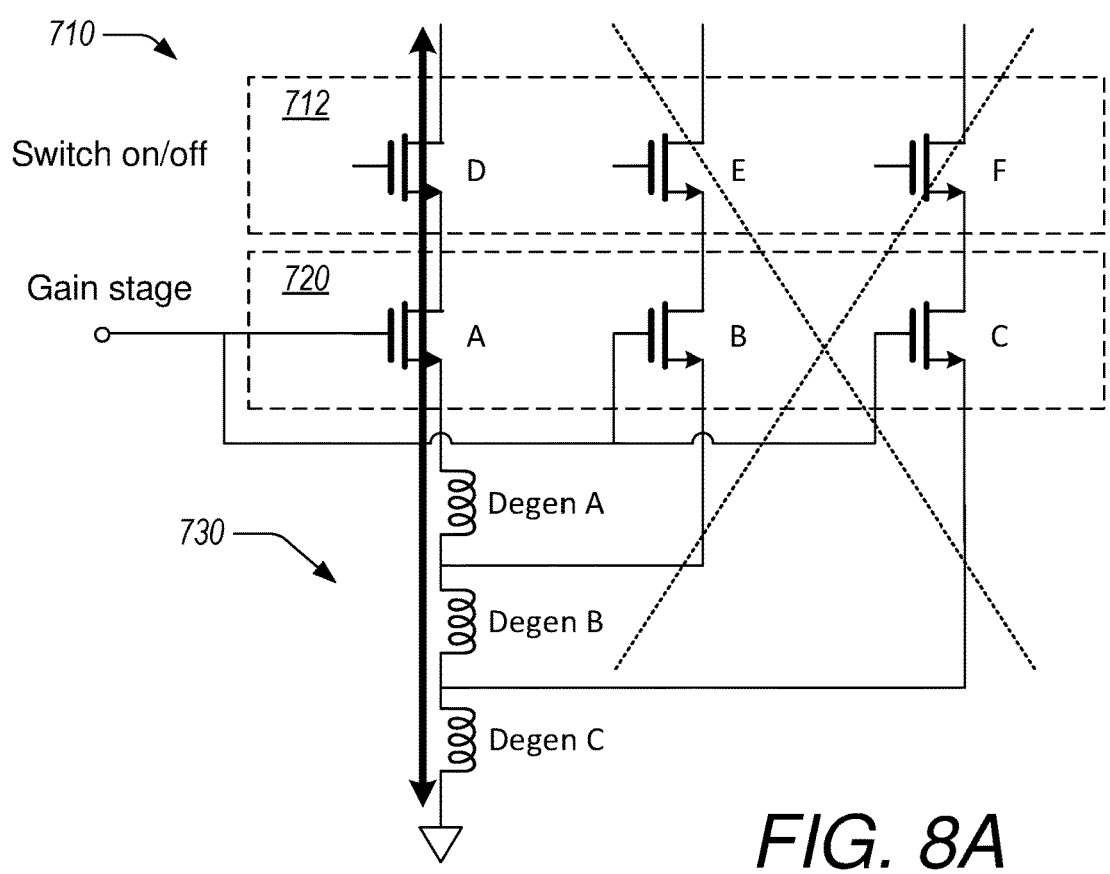
FIG. 8A illustrates an example of a signal directed through gain stage A in the gain stage.

FIG. 8A illustrates an example of a signal directed through gain stage A in the gain stage 720. This signal path sees an impedance provided by the combination of inductor degen A, inductor degen B, and inductor degen C in the degeneration matrix 730. This is controlled by switching on switch D and switching off switches E and F in the gain switching 712. This can be done, for example, in a low gain mode or a high linearity mode.

Figure 8B:
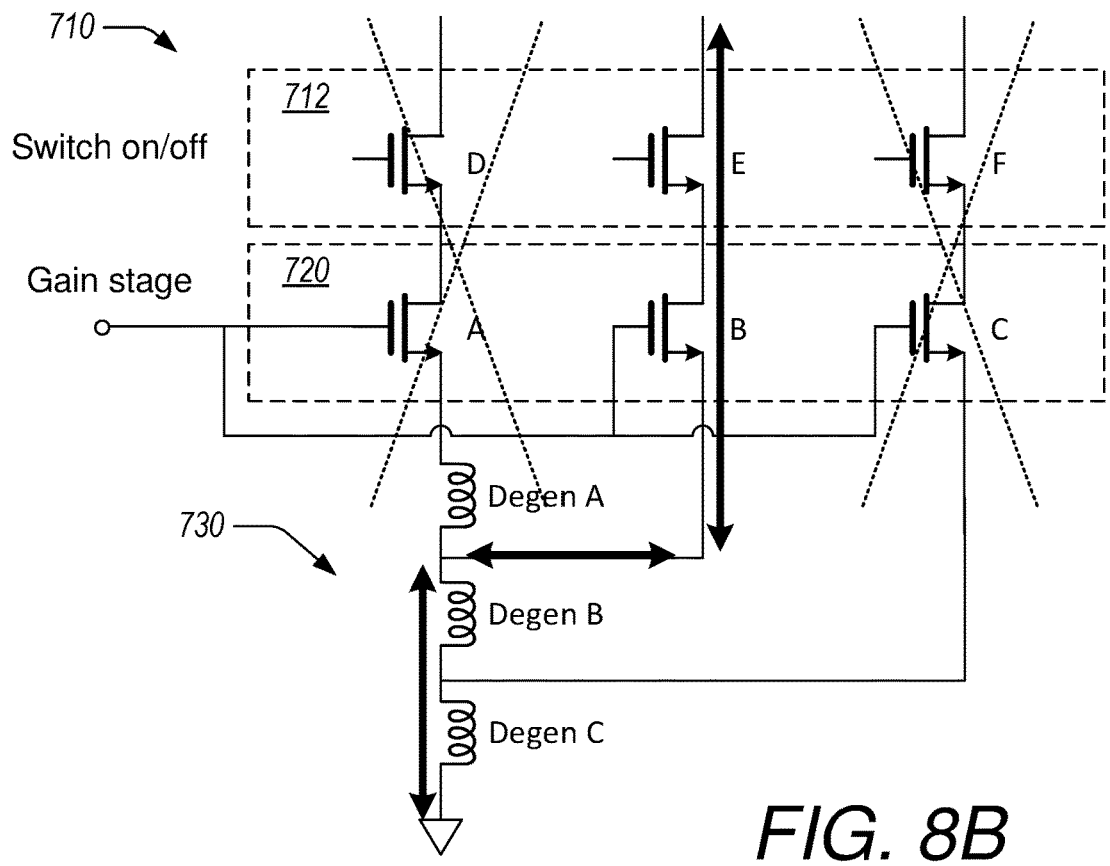
FIG. 8B illustrates an example of a signal directed through gain stage B in the gain stage.

FIG. 8B illustrates an example of a signal directed through gain stage B in the gain stage 720. This signal path sees an impedance provided by the combination of inductor degen B and inductor degen C in the degeneration matrix 730 (and not inductor degen A). This is controlled by switching on switch E and switching off switches D and F in the gain switching 712. This can be done, for example, in a mid-gain mode, a mid-NF mode, or a mid-linearity mode.

Figure 8C:
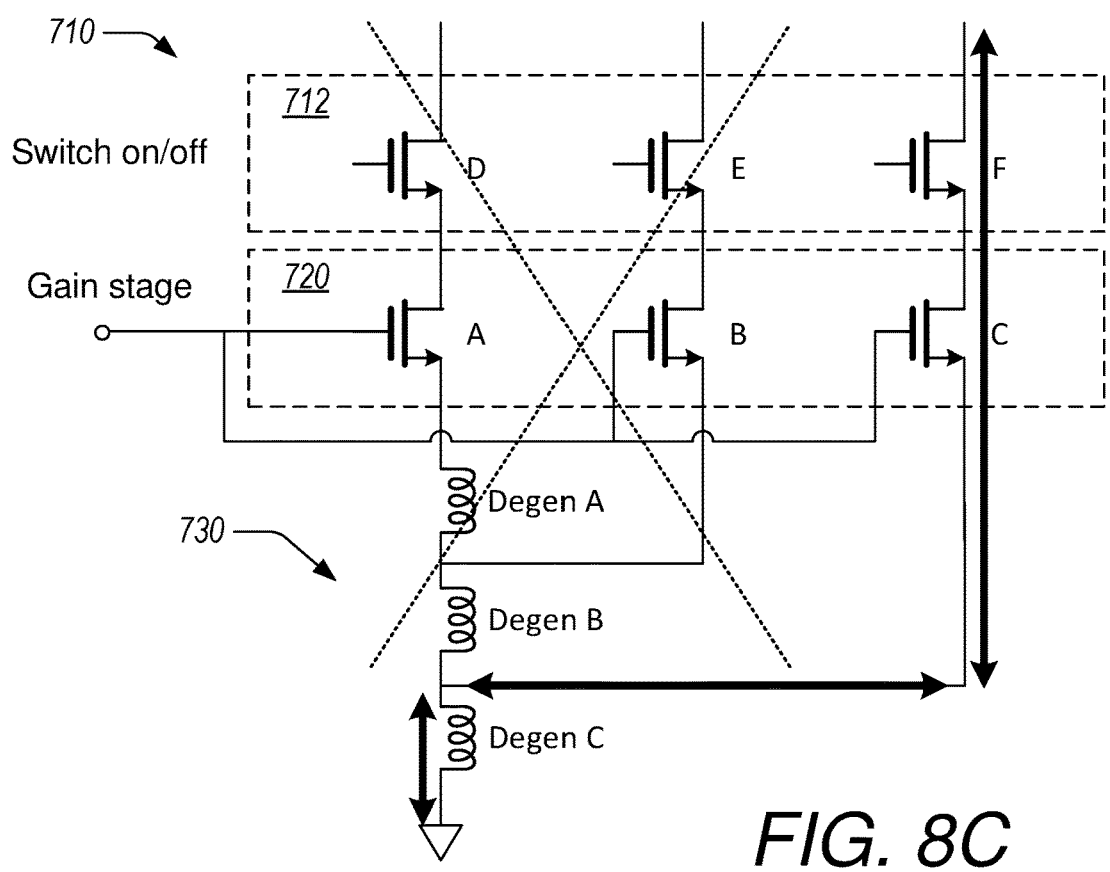
FIG. 8C illustrates an example of a signal directed through gain stage C in the gain stage.

FIG. 8C illustrates an example of a signal directed through gain stage C in the gain stage 720. This signal path sees an impedance provided by inductor degen C in the degeneration matrix 730 (and not inductor degen A or inductor degen B). This is controlled by switching on switch F and switching off switches D and E in the gain switching 712. This can be done, for example, in a high gain mode or a low NF mode.

Figure 9:
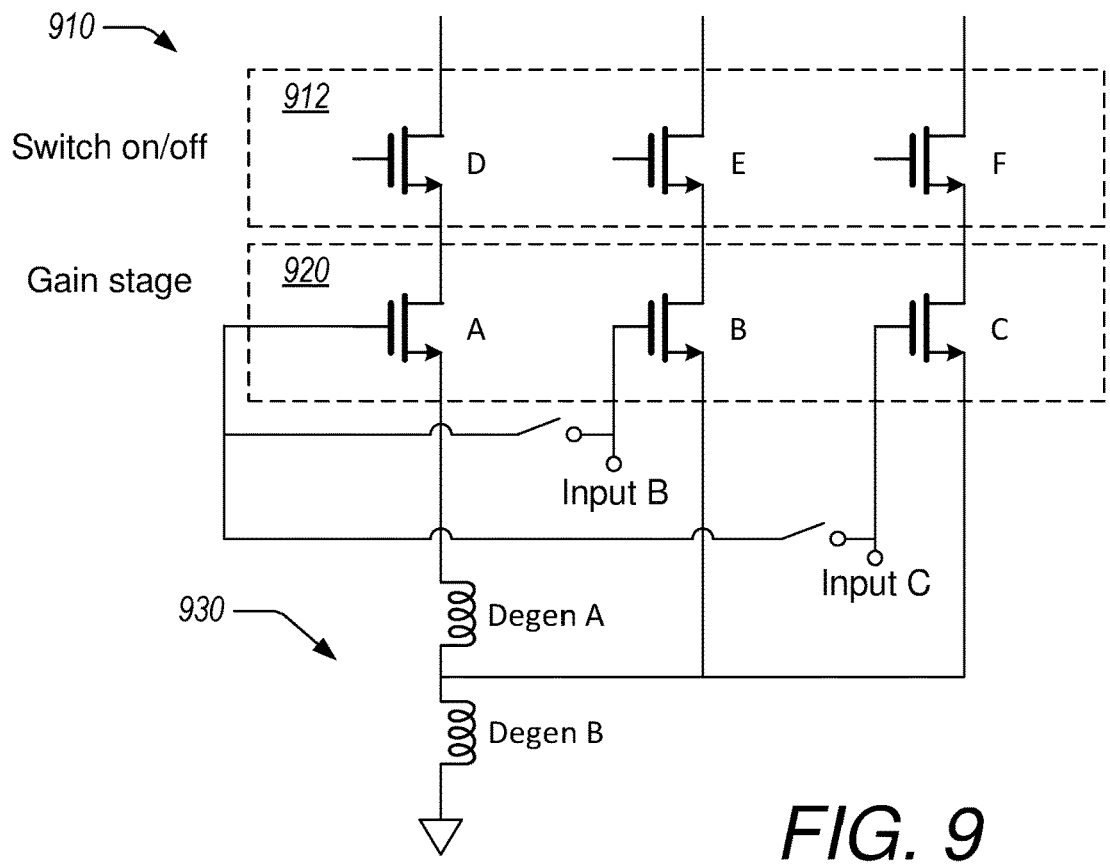
FIG. 9 illustrates an amplifier with a degeneration matrix coupled to a gain stage and gain switching, the degeneration matrix providing two degeneration inductor switching for two inputs B and C.

FIG. 9 illustrates an amplifier 910 with a degeneration matrix 930 coupled to a gain stage 920 and gain switching 912, the degeneration matrix 930 providing two degeneration inductor switching for two inputs B and C. The amplifier 910 is similar to the amplifier 710 with the addition of another input and the removal of the degeneration inductor degen C. Operation is illustrated by the examples in FIGS. 10A-10C. The amplifier 910 illustrates a multi-input amplifier that provides degeneration switching without using switches in the degeneration matrix 930. It is to be understood that these principles can be extended to any number of inputs and/or any number of degeneration inductors. Thus, it should be understood that the disclosed concepts are not to be limited to embodiments with two and three degeneration inductor switching, but can be extended to four or more degeneration inductor switching, and are not to be limited to embodiments with two inputs, but can be extended to three or more inputs.

Figure 10A:
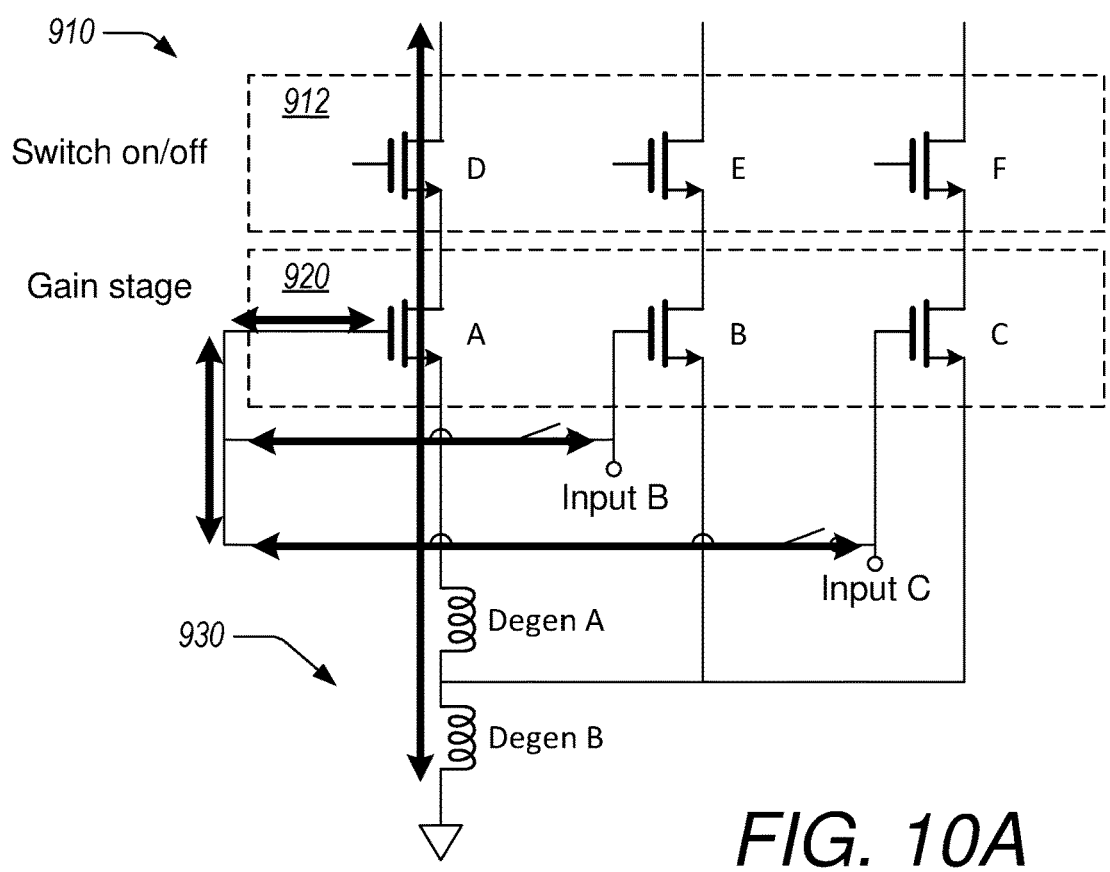
FIG. 10A illustrates an example of a signal from either input B or input C directed through gain stage A in the gain stage.

FIG. 10A illustrates an example of a signal from either input B or input C directed through gain stage A in the gain stage 920. These signal paths see an impedance provided by the combination of inductor degen A and inductor degen B in the degeneration matrix 930. This is controlled by switching on switch D and switching off switches E and F in the gain switching 912. This can be done, for example, in a low or medium gain mode or a high linearity mode for either input B or input C.

Figure 10B:
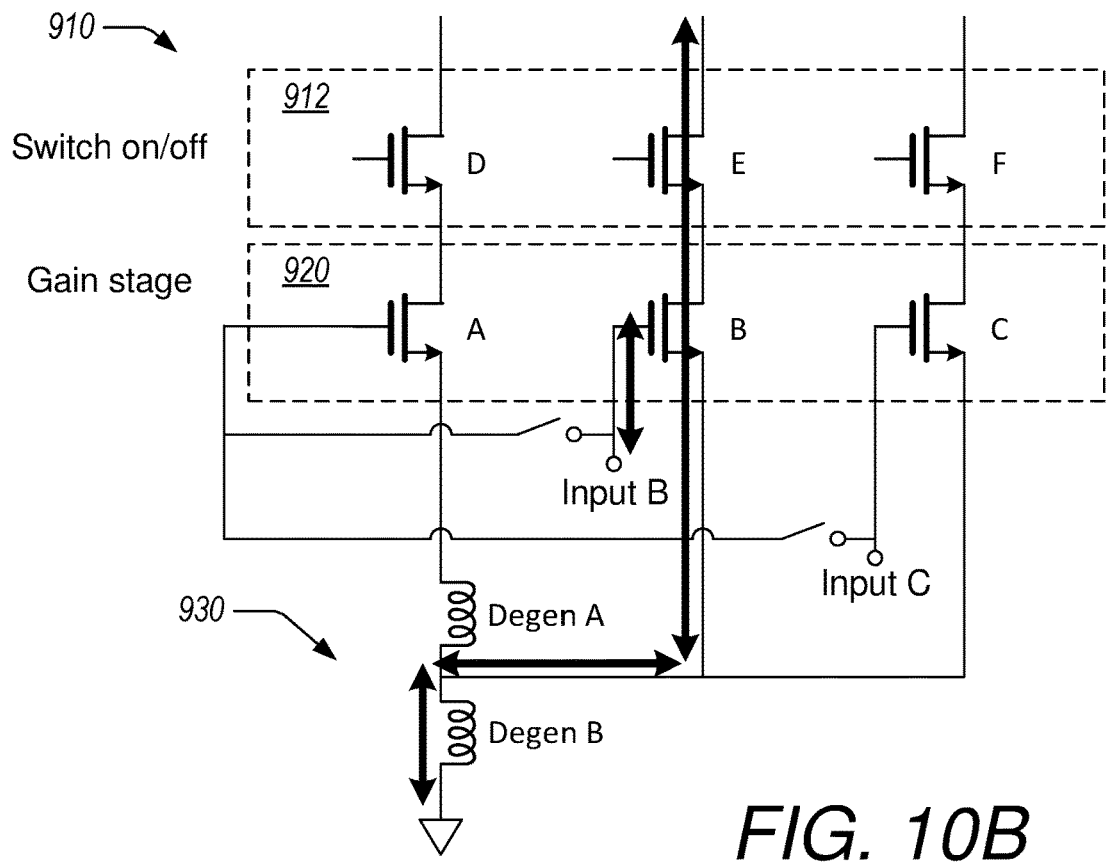
FIG. 10B illustrates an example of a signal from input B directed through gain stage B in the gain stage.

FIG. 10B illustrates an example of a signal from input B directed through gain stage B in the gain stage 920. This signal path sees an impedance provided by inductor degen B in the degeneration matrix 930 (and not inductor degen A). This is controlled by switching on switch E and switching off switches D and F in the gain switching 912. This can be done, for example, in a high gain mode or a low NF mode for input B.

Figure 10C:
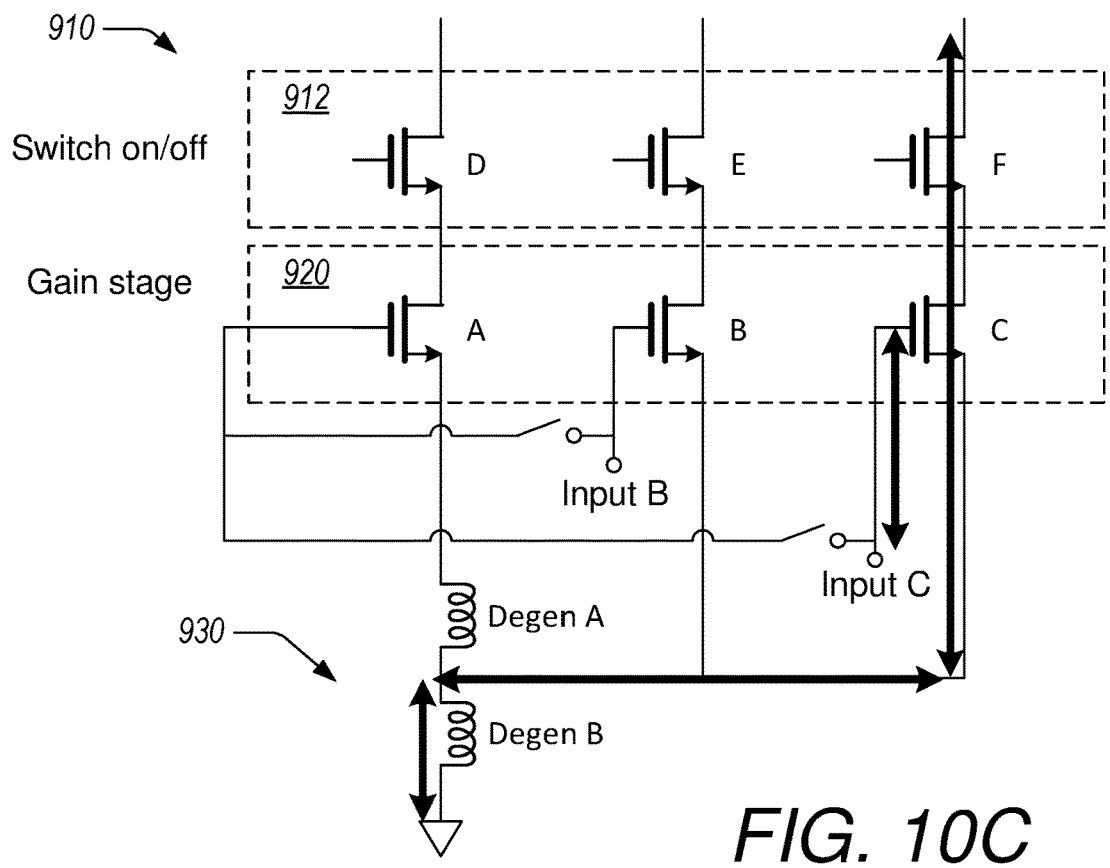
FIG. 10C illustrates an example of a signal directed through gain stage C in the gain stage.

FIG. 10C illustrates an example of a signal directed through gain stage C in the gain stage 920. This signal path sees an impedance provided by inductor degen B in the degeneration matrix 930 (and not inductor degen A). This is controlled by switching on switch F and switching off switches D and E in the gain switching 912. This can be done, for example, in a high gain mode or a low NF mode for input C.

Examples of Products and Architectures

Figure 11:
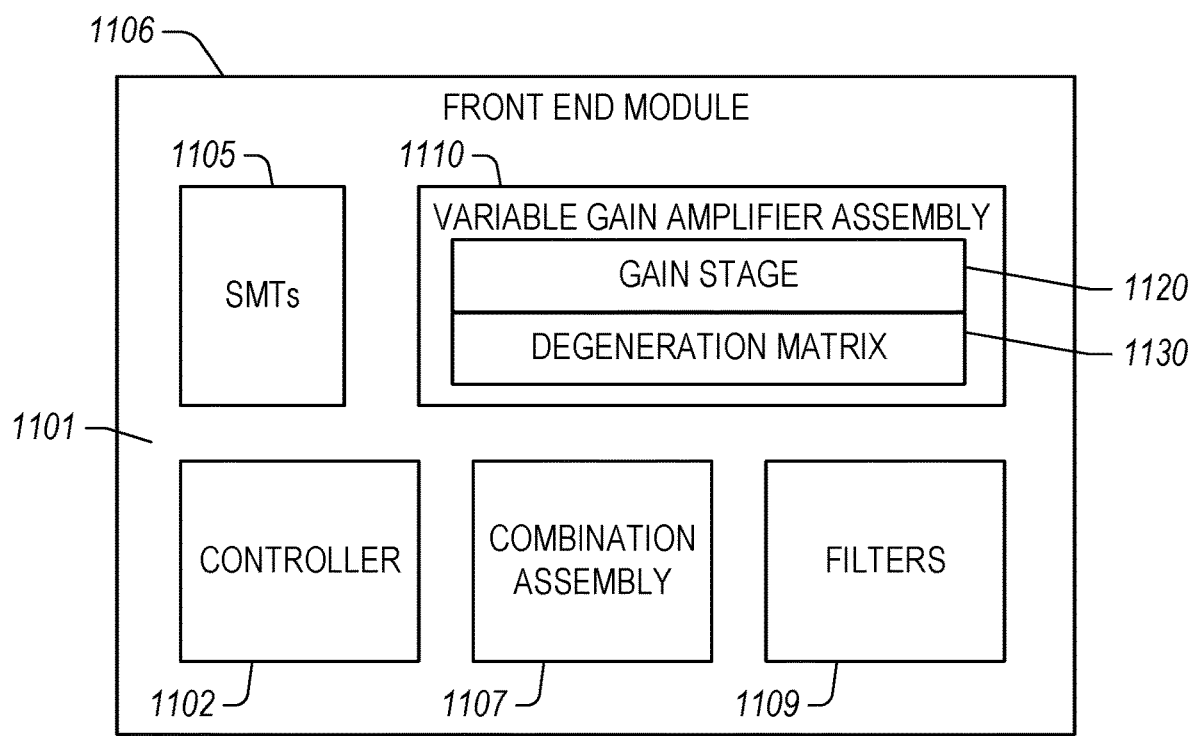
FIG. 11 illustrates that some or all of the amplifier configurations having the combinations of features described herein, can be implemented, wholly or partially, in a module.

FIG. 11 illustrates that in some embodiments, some or all of the amplifier configurations, including some or all of the amplifier configurations having the combinations of features described herein (e.g., FIGS. 1-10C), can be implemented, wholly or partially, in a module. Such a module can be, for example, a front-end module (FEM). Such a module can be, for example, a diversity receiver (DRx) FEM. Such a module can be, for example, a multi-input, multi-output (MiMo) module.

In the example of FIG. 11, a module 1106 can include a packaging substrate 1101, and a number of components can be mounted on such a packaging substrate 1101. For example, a controller 1102 (which may include a front-end power management integrated circuit [FE-PIMC]), a combination assembly 1107, a variable gain amplifier assembly 1110 that includes a gain stage 1120 and a degeneration matrix 1130 having one or more features as described herein, and a filter bank 1109 (which may include one or more bandpass filters) can be mounted and/or implemented on and/or within the packaging substrate 1101. Other components, such as a number of SMT devices 1105, can also be mounted on the packaging substrate 1101. Although all of the various components are depicted as being laid out on the packaging substrate 1101, it will be understood that some component(s) can be implemented over other component(s).

In some implementations, a device and/or a circuit having one or more features described herein can be included in an RF electronic device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 12:
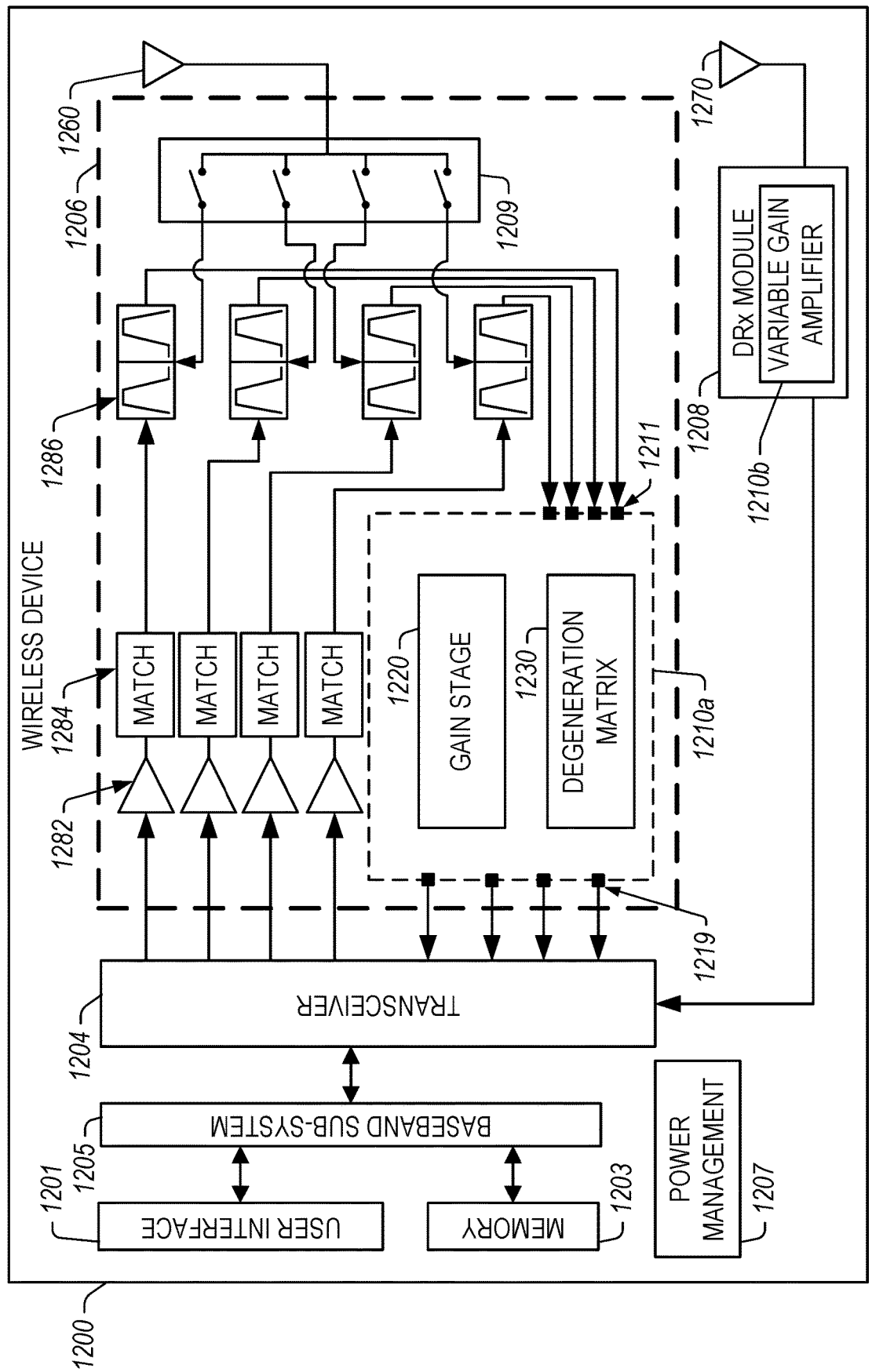
FIG. 12 depicts an example wireless device having one or more advantageous features described herein.

FIG. 12 depicts an example wireless device 1200 having one or more advantageous features described herein. In the context of one or more modules having one or more features as described herein, such modules can be generally depicted by a dashed box 1206 (which can be implemented as, for example, a front-end module) and a diversity receiver (DRx) module 1208 (which can be implemented as, for example, a front-end module).

Referring to FIG. 12, power amplifiers (PAs) 1282 can receive their respective RF signals from a transceiver 1204 that can be configured and operated to generate RF signals to be amplified and transmitted, and to process received signals. The transceiver 1204 is shown to interact with a baseband sub-system 1205 that is configured to provide conversion between data and/or voice signals suitable for a user and RF signals suitable for the transceiver 1204. The transceiver 1204 can also be in communication with a power management component 1207 that is configured to manage power for the operation of the wireless device 1200. Such power management can also control operations of the baseband sub-system 1205 and the modules 1206 and 1208.

The baseband sub-system 1205 is shown to be connected to a user interface 1201 to facilitate various input and output of voice and/or data provided to and received from the user. The baseband sub-system 1205 can also be connected to a memory 1203 that is configured to store data and/or instructions to facilitate the operation of the wireless device, and/or to provide storage of information for the user.

In the example wireless device 1200, outputs of the PAs 1282 are shown to be matched (via respective match circuits 1284) and routed to their respective duplexers 1286. Such amplified and filtered signals can be routed to a primary antenna 1260 through a switching network 1209 for transmission. In some embodiments, the duplexers 1286 can allow transmit and receive operations to be performed simultaneously using a common antenna (e.g., primary antenna 1260). In FIG. 12, received signals are shown to be routed to a variable gain amplifier assembly 1210a, which provides the features and benefits of the variable gain amplifiers described herein. The DRx module 1208 includes a similar variable gain amplifier assembly 1210b as well.

In the example wireless device 1200, signals received at the primary antenna 1260 can be sent to a variable gain amplifier 1210a in the front-end module 1206. The variable gain amplifier 1210a can include a gain stage 1220 and a degeneration matrix 1230 that does not include switches. The variable gain amplifier 1210a is configured to receive a plurality of signals at inputs 1211 and to output a plurality of processed signals at outputs 1219. The variable gain amplifier 1210a is configured to amplify signals by directing signals through the gain stage 1220 based at least in part on a gain mode. The path through the variable gain amplifier 1210a is configured to determine the impedance provide by the degeneration matrix 1230, as described herein. In at least one low gain mode, the gain stage 1220 can be bypassed.

The wireless device also includes a diversity antenna 1270 and a diversity receiver module 1208 that receives signals from the diversity antenna 1270. The diversity receive module 1208 includes a variable gain amplifier 1210b, similar to the variable gain amplifier 1210a in the front-end module 1206. The diversity receiver module 1208 and the variable gain amplifier 1210b process the received signals and transmit the processed signals to the transceiver 1204. In some embodiments, a diplexer, triplexer, or other multiplexer or filter assembly can be included between the diversity antenna 1270 and the diversity receiver module 1270, as described herein.

One or more features of the present disclosure can be implemented with various cellular frequency bands as described herein. Examples of such bands are listed in Table 1. It will be understood that at least some of the bands can be divided into sub-bands. It will also be understood that one or more features of the present disclosure can be implemented with frequency ranges that do not have designations such as the examples of Table 1. It is to be understood that the term radio frequency (RF) and radio frequency signals refers to signals that include at least the frequencies listed in Table 1.

TABLE 1

| Band | Mode | Tx Frequency Range (MHz) | Rx Frequency Range (MHz) |
| --- | --- | --- | --- |
| B1 | FDD | 1,920-1,980 | 2,110-2,170 |
| B2 | FDD | 1,850-1,910 | 1,930-1,990 |

TABLE 1-continued

| Band | Mode | Tx Frequency Range (MHz) | Rx Frequency Range (MHz) |
|---|---|---|---|
| B3 | FDD | 1,710-1,785 | 1,805-1,880 |
| B4 | FDD | 1,710-1,755 | 2,110-2,155 |
| B5 | FDD | 824-849 | 869-894 |
| B6 | FDD | 830-840 | 875-885 |
| B7 | FDD | 2,500-2,570 | 2,620-2,690 |
| B8 | FDD | 880-915 | 925-960 |
| B9 | FDD | 1,749.9-1,784.9 | 1,844.9-1,879.9 |
| B10 | FDD | 1,710-1,770 | 2,110-2,170 |
| B11 | FDD | 1,427.9-1,447.9 | 1,475.9-1,495.9 |
| B12 | FDD | 699-716 | 729-746 |
| B13 | FDD | 777-787 | 746-756 |
| B14 | FDD | 788-798 | 758-768 |
| B15 | FDD | 1,900-1,920 | 2,600-2,620 |
| B16 | FDD | 2,010-2,025 | 2,585-2,600 |
| B17 | FDD | 704-716 | 734-746 |
| B18 | FDD | 815-830 | 860-875 |
| B19 | FDD | 830-845 | 875-890 |
| B20 | FDD | 832-862 | 791-821 |
| B21 | FDD | 1,447.9-1,462.9 | 1,495.9-1,510.9 |
| B22 | FDD | 3,410-3,490 | 3,510-3,590 |
| B23 | FDD | 2,000-2,020 | 2,180-2,200 |
| B24 | FDD | 1,626.5-1,660.5 | 1,525-1,559 |
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |
| B32 | FDD | N/A | 1,452-1,496 |
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |
| B45 | TDD | 1,447-1,467 | 1,447-1,467 |
| B46 | TDD | 5,150-5,925 | 5,150-5,925 |
| B65 | FDD | 1,920-2,010 | 2,110-2,200 |
| B66 | FDD | 1,710-1,780 | 2,110-2,200 |
| B67 | FDD | N/A | 738-758 |
| B68 | FDD | 698-728 | 753-783 |

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A variable-gain signal amplifier comprising:
a variable-gain stage configured to receive an input signal and generate an amplified output signal, the variable-gain stage including a plurality of gain stages and an isolation switch that isolates inputs to each of the plurality of gain stages; and
a degeneration matrix coupled to the variable-gain stage and configured to provide a plurality of tailored impedance levels for the variable-gain stage depending on a path through the variable-gain stage, the degeneration matrix not including any switches.

2. The amplifier of claim 1 wherein the amplifier is configured to selectively provide a bypass path that bypasses the variable-gain stage and an amplification path that passes through the variable-gain stage.

3. The amplifier of claim 1 wherein the degeneration matrix is further configured to provide tailored impedances to the variable-gain stage depending on a gain mode of a plurality of gain modes of the variable gain signal amplifier.

4. The amplifier of claim 3 wherein the tailored impedances are configured to provide improved linearity in the amplified output signal relative to a variable-gain stage that is not coupled to the degeneration matrix with the tailored impedances.

5. The amplifier of claim 3 wherein the degeneration matrix is configured to provide a first tailored impedance for a first gain mode of the plurality of gain modes and a second tailored impedance for a second gain mode of the plurality of gain modes.

6. The amplifier of claim 5 wherein the first tailored impedance is greater than the second tailored impedance and the first gain mode is less than the second gain mode.

7. The amplifier of claim 1 further comprising a bypass block coupled to an input of the variable-gain stage, the bypass block configured to be activated in a low gain mode to provide a bypass path that does not include the variable-gain stage.

8. The amplifier of claim 7 wherein the bypass path does not include the degeneration matrix.

9. The amplifier of claim 1 wherein the degeneration matrix is configured to provide three or more degeneration inductor switching.

10. The amplifier of claim 1 further comprising a plurality of input nodes coupled to the variable-gain stage.

11. The amplifier of claim 10 wherein the amplifier is configured to receive a plurality of input signals at the plurality of input nodes, individual received signals having frequencies within different signal frequency bands.

12. The amplifier of claim 11 wherein the amplifier is configured to amplify signals received at individual input ports independent of amplification of other received signals.

13. The amplifier of claim 10 wherein the degeneration matrix is configured to provide two or more degeneration inductor switching.

14. A front end architecture comprising:
a variable gain signal amplifier including a variable-gain stage configured to receive an input signal and generate an amplified output signal, the variable-gain stage including a plurality of gain stages and an isolation switch that isolates inputs to each of the plurality of gain stages, and a degeneration matrix coupled to the variable-gain stage and configured to provide a plurality of tailored impedance levels for the variable-gain stage depending on a path through the variable-gain stage, the degeneration matrix not including any switches;
a filter assembly coupled to the variable gain signal amplifier to direct frequency bands to select inputs of the variable gain signal amplifier; and
a controller implemented to control the variable gain signal amplifier to provide a plurality of gain modes such that, in a low gain mode, the variable gain signal amplifier directs signals along a path that bypasses the variable-gain stage.

15. The architecture of claim 14 wherein the degeneration matrix is further configured to provide three or more tailored impedances to the variable-gain stage.

16. The architecture of claim 15 wherein the tailored impedances are configured to provide improved linearity in the amplified output signal relative to a variable-gain stage that is not coupled to the degeneration matrix with the tailored impedances.

17. The architecture of claim 15 wherein the degeneration matrix is configured to provide a first tailored impedance for a first gain mode of a plurality of gain modes and a second tailored impedance for a second gain mode of the plurality of gain modes.

18. A wireless device comprising:
a diversity antenna;
a filter assembly coupled to the diversity antenna to receive signals and to direct frequency bands along select paths;
a variable gain signal amplifier including a variable-gain stage configured to receive an input signal and generate an amplified output signal, the variable gain-stage including a plurality of gain stages and an isolation switch that isolates inputs to each of the plurality of gain stages, and a degeneration matrix coupled to the variable-gain stage and configured to provide a plurality of tailored impedance levels for the variable-gain stage depending on a path through the variable-gain stage, the degeneration matrix not including any switches; and
a controller implemented to control the variable gain signal amplifier to provide a plurality of gain modes such that, in a low gain mode, the variable gain signal amplifier directs signals along a path that bypasses the variable-gain stage.

19. The device of claim 18 wherein the degeneration matrix is further configured to provide three or more tailored impedances to the variable-gain stage.

20. The device of claim 19 wherein the degeneration matrix is configured to provide a first tailored impedance for a first gain mode of a plurality of gain modes and a second tailored impedance for a second gain mode of the plurality of gain modes.

* * * * *